(12) United States Patent
Makita et al.

(10) Patent No.: US 6,770,515 B1
(45) Date of Patent: Aug. 3, 2004

(54) SEMICONDUCTOR DEVICE AND METHOD FOR FABRICATING THE DEVICE

(75) Inventors: Naoki Makita, Nara (JP); Masao Moriguchi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/660,516

(22) Filed: Sep. 12, 2000

(30) Foreign Application Priority Data

Sep. 22, 1999 (JP) .......................................... 11-268487

(51) Int. Cl.$^7$ ........................ H01L 21/00; H01L 21/84; H01L 21/20; H01L 21/04; H01L 21/425; H01L 27/01; H01L 27/12

(52) U.S. Cl. ...................... 438/149; 438/479; 438/517; 257/347

(58) Field of Search ................................ 257/347, 258; 438/149, 479, 517, 162

(56) References Cited

U.S. PATENT DOCUMENTS

| | | | |
|---|---|---|---|
| 4,855,201 A | * 8/1989 | Badesha et al. ............ 399/159 |
| 5,569,935 A | 10/1996 | Takemura et al. |
| 5,608,232 A | * 3/1997 | Yamazaki et al. .......... 257/347 |
| 5,639,698 A | * 6/1997 | Yamazaki et al. ............ 117/8 |
| 5,661,311 A | 8/1997 | Takemura et al. |
| 5,904,770 A | 5/1999 | Ohtani et al. |
| 5,970,327 A | 10/1999 | Makita et al. |
| 5,986,286 A | 11/1999 | Yamazaki et al. |
| 6,010,924 A | 1/2000 | Takemura et al. |
| 6,084,247 A | * 7/2000 | Yamazaki et al. .......... 257/347 |
| 6,337,232 B1 | * 1/2002 | Kusumoto et al. .......... 438/149 |
| 6,348,368 B1 | 2/2002 | Yamazaki et al. |
| 2002/0090765 A1 | 7/2002 | Yamazaki et al. |

FOREIGN PATENT DOCUMENTS

| | | |
|---|---|---|
| JP | 07-066424 | 3/1995 |
| JP | 7-273027 | 10/1995 |
| JP | 7307286 | 11/1995 |
| JP | 07335905 | 12/1995 |
| JP | 08-022954 | 1/1996 |
| JP | 08-204206 | 8/1996 |
| JP | 11-191628 | 7/1999 |
| KR | 1998-703115 | 10/1998 |

OTHER PUBLICATIONS

Lee te al. (Au metal–induced lateral crystallization (MILC) of hydrogenated amorphous silicon thin film with very low annealing temperature and fast MILC rate, electronics letters Jun. 24, 1999 vol. 35 No. 13).*

Thompson et al. (Silicide precipitation and silicon crystallization in nickel implanted amorphous silicon thin films, Journal of material science, vol. 5, No 10 Oct. 1990).*

"Silicide Precipitation and Silicon Crystallization in Nickel Implanted Amorphous Silicon Thin Films", Cammarata et al., 1990 Materials Research Society, Oct. 1990, vol. 5, No. 10, pp. 2133–2138.

Korean Office Action dated Aug. 28, 2003.

* cited by examiner

*Primary Examiner*—Eddie Lee
*Assistant Examiner*—Samuel A Gebremariam
(74) *Attorney, Agent, or Firm*—Nixon & Vanderhye P.C.

(57) ABSTRACT

A TFT 123 formed on a glass substrate 101 has a crystalline silicon film 108 that serves as an active region. The crystalline silicon film 108 is formed by forming an a-Si film 103 containing hydrogen on the glass substrate 101, thereafter adding nickel 104 to the surface of the a-Si film 103 and subjecting the a-Si film 103 to which the nickel 104 has been added to heat treatment. The crystal grain size of each crystal of the crystalline silicon film 108 is smaller than the size of the channel region of a TFT 123. With this arrangement, a high-performance semiconductor device that has stable characteristics with little characteristic variation and a high integration density and is simply fabricated with high yield can be provided.

58 Claims, 8 Drawing Sheets

SEMICONDUCTOR DEVICE AND METHOD FOR FABRICATING THE DEVICE

BACKGROUND OF THE INVENTION

The present invention relates to a semiconductor device that has an active region of a crystalline silicon film obtained by crystallizing an amorphous silicon film and a method for fabricating the device. The present invention is effective, in particular, for a semiconductor device that employs a thin film transistor (TFT) provided on a substrate having an insulating surface and is able to be utilized for an active matrix type liquid crystal display device, a contact-type image sensor, a three-dimensional IC and the like.

In recent years, there have been attempts to form a high-performance semiconductor device on an insulating substrate of glass or an insulating film for the achievement of a large-size high-resolution liquid crystal display device, a high-speed high-resolution contact-type image sensor, a three-dimensional IC and the like. It is general to use thin-film-shaped silicon semiconductors as semiconductor elements for use in these devices. The silicon semiconductors can be roughly categorized into the two types of an amorphous silicon semiconductor (a-Si) and a silicon semiconductor having crystallinity.

The amorphous silicon semiconductor, which can be relatively easily fabricated by the vapor deposition method at a low fabricating temperature and suitable for mass production, is most generally used. However, the amorphous silicon semiconductor has inferior physical properties of electrical conductivity and so on with respect to the silicon semiconductor having crystallinity. Therefore, in order to obtain a higher-speed characteristic, it is strongly demanded to establish a method for fabricating a semiconductor device made of a silicon semiconductor having crystallinity. As a silicon semiconductor having crystallinity, there are known polysilicon, microcrystal silicon, amorphous silicon including a crystalline component and semi-amorphous silicon having a state intermediate between the crystalline property and the amorphous property.

As a method for obtaining a silicon semiconductor having crystallinity, there are known the following methods (1) through (3).

(1) A method for directly forming a film having crystallinity in a film-forming stage
(2) A method for forming an amorphous semiconductor film and crystallizing the film by the energy of laser light
(3) A method for forming an amorphous semiconductor film and crystallizing the film by applying thermal energy However, according to the aforementioned method (1), crystallization progresses concurrently with the film forming process. Therefore, in order to obtain a silicon film having crystals of a large grain size, it is indispensable to increase the thickness of the silicon film. It is technically difficult to uniformly form a silicon film having satisfactory semiconductor properties thoroughly on the entire surface of the substrate.

According to the aforementioned method (2), which utilizes the crystallization phenomenon through a melting and solidifying process, the grain boundaries are satisfactorily processed although the grain size is small, allowing a high-quality crystalline silicon film to be obtained. However, taking the excimer laser, which is currently most generally used, as an example, it is difficult to uniformly process the entire surface of a large-area substrate since the laser stability is not sufficient.

According to the aforementioned method (3), which is advantageous in terms of uniformity and stability inside the substrate by comparison with the methods (1) and (2), is used for a microminiature high-definition LCD panel employing a quartz substrate. However, in this case, after growing crystals through heat treatment at a temperature of 600° C. for a long time of about 30 hours, the crystals are further subjected to heat treatment at an high temperature of about 1000° C. for several tens of minutes to several hours for the promotion of improvement in crystallinity, and this results in a prolonged processing time and a degraded throughput. If a TFT is fabricated with this crystallized silicon film, then only the device characteristic of a field effect mobility of about 100 $cm^2/Vs$ can be obtained.

In order to solve the aforementioned problems, a method of an improvement of the aforementioned method (3) is disclosed in Japanese Patent Laid-Open Publication No. HEI 7-335905. This Japanese Patent Laid-Open Publication No. HEI 7-335905 discloses a reduction in heating temperature, a reduction in processing time and an improvement in crystallinity by utilizing a catalytic element that promotes the crystallization of the amorphous silicon film.

Specifically, a trace quantity of a metallic element of nickel, palladium or the like is introduced into the surface of the amorphous silicon film, and thereafter heat treatment is performed. With regard to the mechanism of low-temperature crystallization, the generation of a crystalline nucleus occurs in the early stage with the metallic element serving as the nucleus. Subsequently, the metallic element serves as a catalyst to promote the crystal growth for the rapid promotion of the crystallization, according to the understanding. In this sense, the aforementioned metallic element is referred to as a "catalytic element" hereinafter. By comparison with the twin crystal structure in one particle of the crystalline silicon film crystallized by the normal solid phase epitaxy, the crystalline silicon film that has undergone crystal growth with the catalytic element forms an aggregate of a number of columnar crystals, each of which has an almost ideal monocrystalline internal state.

According to the method of the aforementioned Japanese Patent Laid-Open Publication No. HEI 7-335905, crystals grow sidewise (in a direction parallel to the substrate) from the region into which the catalytic element is introduced by crystallizing only the region into which the catalytic element is selectively introduced with the other portion remaining in a state of an amorphous silicon film through selective introduction of the catalytic element into part of the amorphous silicon film and heating of the same and further prolonging the heating time.

Furthermore, according to the method of the aforementioned Japanese Patent Laid-Open Publication No. HEI 7-335905, the sidewise crystal growth distance is increased by forming the amorphous silicon film that is the start film to be crystallized by the low pressure CVD method, and the active region of the thin film transistor is formed by using the sidewise crystal growth region.

In contrast to this, the Japanese Patent Laid-Open Publication No. HEI 7-307286 discloses another example of the use of the catalytic element, or the use of the catalytic element for dehydrogenation in the amorphous silicon film.

Specifically, the dehydrogenating reaction in the amorphous silicon film is promoted by introducing the catalytic element into the amorphous silicon film containing hydrogen and heating the film at a low temperature of not higher than 550° C., and thereafter, the amorphous silicon film is crystallized by laser light application. The dehydrogenation in the amorphous silicon film is thus promoted and thereafter the amorphous silicon film is crystallized by laser light application. Therefore, the film exfoliation is hard to be caused by rapid dehydrogenation of the silicon film even if the laser light application is performed, and a crystalline silicon film having uniform crystallinity is obtained.

As disclosed in the aforementioned Japanese Patent Laid-Open Publication No. HEI 7-335905 and the Japanese Patent Laid-Open Publication No. HEI 7-307286, the crystalline silicon film obtained by introducing the catalytic element into the amorphous silicon film and crystallizing the film through heat treatment is excellent in terms of crystallinity. In particular, the crystal orientation is closer to the conventional monocrystal than the polycrystal. Through confirmation with a TEM (Transmission Electron Microscope), the present inventor has obtained a distinct diffraction pattern that exhibits a monocrystal state even in a wide range of selected area of a diameter of 25 $\mu$m.

The above is because a crystalline silicon film fabricated with a catalytic element has undergone a definitely different peculiar crystal growth from that of a crystalline silicon film fabricated by the conventional solid phase epitaxy method that has a very low nucleus incident rate and causes only the temporary generation of a crystalline nucleus. Therefore, in the crystalline silicon film fabricated with the catalytic element, the crystal grain grown from each crystalline nucleus grows very large to have a grain size of up to 10 $\mu$m to 30 $\mu$m. The crystal particle is normally called the grain. However, there exist a number of more minute particles inside the crystal grain grown as a crystal from an identical nucleus, and therefore, the crystal grain is referred to as a domain hereinafter.

If a plurality of TFT's are fabricated with such a crystalline silicon film, then the particle diameter of each domain is very large and randomly exist. Accordingly, there are included TFT's fabricated inside the domain and TFT's fabricated across the grain boundaries. Therefore, if a TFT is fabricated inside the domain, a high-performance TFT is obtained. However, if a TFT is fabricated across the grain boundary, the TFT has an inferior ability. This consequently causes a problem that the TFT characteristics (mobility, threshold voltage value, etc.) vary within the crystalline silicon film.

As proposed in Japanese Patent Laid-Open Publication No. HEI 7-335905, this problem seems to be simply solved by the method of selectively introducing the catalytic element into the amorphous silicon film and growing a crystal sidewise from the region into which the catalytic element has been introduced. However, according to this method, the characteristic variation becomes more significant. The above is because nuclei randomly occur in the region into which the catalytic element has been introduced before the sidewise crystal growth, and the domain grown from each nucleus merely progresses further sidewise. Therefore, domains elongated in the direction of growth exist along the direction of growth in the region to be used as a TFT active region, and therefore, it is sometimes the case where a TFT is fabricated across the grain boundary. This consequently varies the TFT characteristics.

It is to be noted that the domain mentioned in connection with the present invention emerges as a stepped portion by etching the Si surface with hydrofluoric acid or oxidizing the Si surface, and the domain can also be confirmed as a difference in contrast by an optical microscope.

SUMMARY OF THE INVENTION

Accordingly, the object of the present invention is to provide a stable high-performance semiconductor device having little characteristic variation and a high-performance semiconductor device having a high integration density. Another object is to provide a semiconductor device fabricating method capable of simply fabricating such a semiconductor device with high yield.

In order to achieve the above object, there is provided a semiconductor device comprising a plurality of thin film transistors formed with a silicon film having crystallinity serving as an active region on a substrate having an insulating surface, the silicon film being a polysilicon including a catalytic element for promoting crystallization of the silicon film itself, and the silicon film having a constituent crystal grain size smaller than a size of a channel region of each of the thin film transistors.

The silicon film crystallized with the catalytic element has a crystalline structure of an aggregate of columnar crystals from a microscopic viewpoint as described above. The silicon film structure itself reduces the defects inside the crystal grain. If the silicon film is used for the active regions (source/drain region and channel region) of the thin film transistor, then a high current driving ability is provided. In order to reduce the characteristic variation between elements while keeping this high current driving ability, the grain boundary is required to be controlled. However, it is theoretically required to perform control at the microscopic level, which is impossible.

Therefore, according to the semiconductor device of the above constitution, it has been discovered that the above object can be achieved by constructing the active regions of a plurality of thin film transistors of the crystalline silicon film including the catalytic element for promoting the crystallization and setting the crystal grain size of each crystal in the crystalline silicon film smaller than the size of the channel region of each thin film transistor. That is, by setting the size of crystal grain constituting the crystalline silicon film smaller than the size of the channel region formed in the thin film transistor, the characteristic variation of the thin film transistor can be remarkably improved.

In particular, the active matrix substrate for liquid crystal display use or the like is required to have higher characteristic uniformity since the characteristic variations of the thin film transistors for driving the pixel electrodes appear as a display unevenness. Therefore, by applying the present invention to the active matrix substrate or the like, a device of sufficient display quality can be obtained, and a driver monolithic structure in which a driver circuit is concurrently formed in the peripheral portion can be provided.

In one embodiment of the present invention, the constituent crystal grain size of the silicon film is not greater than 5 $\mu$m.

In this constitution, the crystal grain size of each polysilicon including the catalytic element should preferably be not greater than 5 $\mu$m. It has been discovered that the characteristic variations of the normally formed thin film transistors can be more surely reduced if the crystal grain size is within this range.

If the crystal grain size of the silicon film is greater than 5 $\mu$m, then the thin film transistors are sometimes fabricated across the grain boundaries, increasing the characteristic variations of the thin film transistors.

In one embodiment of the present invention, the catalytic element is the element of nickel and the concentration of the element of nickel in the silicon film is within a range of $1\times10^{16}$ to $1\times10^{18}$ atoms/cm$^3$.

In this constitution, the catalytic element to be contained in the silicon film that constitutes the active regions of the thin film transistors should preferably be the element of nickel. That is, it has been discovered that the element of nickel can form a silicon film of the best crystallinity among catalytic elements.

It has also been discovered that a silicon film of satisfactory crystallinity can be formed by setting the catalytic element concentration in the silicon film to $1\times10^{16}$ to $1\times10^{18}$ atoms/cm$^3$.

If the catalytic element concentration in the silicon film is lower than $1\times10^{16}$ atoms/cm$^3$, then the effect of sufficient crystal growth cannot be obtained since the concentration is less than the solubility limit.

If the catalytic element concentration in the silicon film becomes higher than $1\times10^{10}$ atoms/cm$^3$, then the device characteristics receive bad influence to cause an increase in leak current or the like.

Also, there is provided a semiconductor device fabricating method comprising:

a process for forming an amorphous silicon film containing hydrogen on a substrate having an insulating surface;

a process for adding to a surface of the amorphous silicon film a catalytic element for promoting crystallization of the amorphous silicon film; and a process for crystallizing the amorphous silicon film by subjecting the amorphous silicon film to which the catalytic element has been added to heat treatment.

According to the semiconductor device fabricating method, the amorphous silicon film containing hydrogen is formed on the substrate having the insulating surface, and thereafter, the catalytic element for promoting the crystallization is added to the amorphous silicon film containing hydrogen. If the amorphous silicon film to which the catalytic element has been added is subjected to heat treatment, then the crystal growth starts from the upper surface side of the amorphous silicon to crystallize the amorphous silicon film. As a result, the crystallized silicon film has a satisfactory crystalline structure of a columnar crystal network structure, and the grain size of individual crystal becomes minute. That is, the intended crystalline silicon film of the present invention is obtained. By employing such a crystalline silicon film, the TFT characteristic variation inside the substrate is improved to allow a semiconductor device having excellent characteristic uniformity to be provided.

Also, there is provided a semiconductor device fabricating method comprising:

a process for adding a catalytic element for promoting crystallization of an amorphous silicon film to a substrate having an insulating surface;

a process for forming the amorphous silicon film containing hydrogen on the surface which belongs to the substrate and to which the catalytic element has been added; and a process for crystallizing the amorphous silicon film by subjecting the amorphous silicon film to heat treatment.

According to the semiconductor device fabricating method, the catalytic element for promoting the crystallization of the amorphous silicon film is added to the substrate having an insulating surface, and thereafter, the amorphous silicon film containing hydrogen is formed on the surface of the substrate to which the catalytic element is added. The, upon subjecting the amorphous silicon film to heat treatment, crystal growth starts from the lower surface side of the amorphous silicon to crystallize the amorphous silicon film. As a result, the crystallized silicon film has a crystalline structure of a satisfactory columnar crystal network structure, and the grain size of individual crystal becomes minute. That is, the intended crystalline silicon film of the present invention is obtained. By employing such a crystalline silicon film, the TFT characteristic variation inside the substrate is improved to allow a semiconductor device having excellent characteristic uniformity to be provided.

In one embodiment of the present invention, the hydrogen concentration in the amorphous silicon film is within a range of 3 to 25 atomic percent.

The semiconductor device fabricating method of the embodiment is based on the following phenomenon discovered by the present inventor. According, to the examination carried out by the present inventor, it has been discovered that the hydrogen in the amorphous silicon film exerts a great influence on the crystal form. That is, the crystal grain size of the crystalline silicon film obtained through the heat treatment after the addition of the catalytic element drastically changes across a specified value depending on the concentration of hydrogen contained in the amorphous silicon film.

FIG. 9 is a graph showing a relation between the hydrogen concentration in the initial amorphous silicon film and the crystal grain size of the silicon film crystallized by the catalytic element. In this case, the element of nickel is used as the catalytic element. Despite that the concentration of the element of nickel is set identical ($5\times10^{12}$ atoms/cm$^2$ by the concentration in the surface after addition), as shown in FIG. 9, the crystal grain size abruptly increases when the hydrogen concentration is reduced to a value under a specified value. This threshold value is about 3 to 5 atomic %.

FIG. 10A is a view of an optical microscope photograph of the surface state of a crystalline silicon film obtained by crystallizing an amorphous silicon film having a hydrogen concentration of not higher than 3 atomic %. As shown in FIG. 10A, if the hydrogen concentration in the amorphous silicon film is not higher than 3 atomic %, then a very large crystal grain that exceeds a grain size of 30 μm is observed. FIG. 10B is a view of an optical microscope photograph of the surface state of a crystalline silicon film obtained by crystallizing an amorphous silicon film having a hydrogen concentration of about 10 atomic %. FIG. 10A and FIG. 10B have an identical magnification ratio. If the hydrogen concentration in the amorphous silicon film is about 10 atomic %, then the crystal grain is very small, and as shown in FIG. 10B, it is very difficult to confirm the crystal grain size by an optical microscope. According to the observation by TEM, the crystal grain size was about 1 to 2 μm.

As described above and apparent from the curve of the graph of FIG. 9, the crystal growth states shown in FIGS. 10A and 10B have quite different growth modes rather than on the extension of change in hydrogen concentration. Then, the threshold value across which the growth mode changes exists within the hydrogen concentration range of 3 to 5 atomic %. If the hydrogen concentration in the amorphous silicon film is lower than the threshold value of 3 atomic %, then the growth from each nucleus is great and a gigantic crystal grain is formed although the density of occurrence of crystalline nuclei is extremely reduced. If the hydrogen concentration in the amorphous silicon film exceeds the threshold value of 5 atomic %, then the growth from each nucleus is little and the crystal grain becomes minute although the density of occurrence of crystalline nuclei is extremely increased. In either case, the density of occurrence of crystalline nuclei is changed by the concentration of the added catalytic element. However, the changes are limited in the respective modes, and a decisive difference depending on the change in hydrogen concentration in the amorphous silicon film can be observed at whatever catalytic element concentration.

Of course, the addition of the catalytic element should preferably be little considering the influence on the semiconductor. However, if the addition of the catalytic element is little, then an uncrystallized region remains in the crystalline silicon film as shown in FIGS. 10A and 10B, degrading the semiconductor characteristics. How the uncrystallized region remains largely depends on the difference in hydrogen concentration in the amorphous silicon film. In the case of the low hydrogen concentration in FIG. 10A, the uncrystallized region remains in a large region in correspondence with the giganticness of the crystal grain. Strangely enough, the occurrence of a crystalline nucleus in this uncrystallized region is not observed at all. In the case of the high hydrogen concentration in FIG. 10B, where the crystalline nuclei are minute and the density of occurrence of the crystalline nuclei is high, if the uncrystallized region remains at the same areal rate as that in the case of FIG. 10A, then the individual uncrystallized regions are small and uniformly dispersed inside the film. Not only the nonuniformity simply attributed to the crystal grain but also how the uncrystallized region remains exert a great influence on the semiconductor characteristic variation. Particularly when it is desired to restrain the catalytic element, the low hydrogen concentration is not permitted in terms of uniformity. In contrast to this, when the hydrogen concentration is within the range of 3 to 25 atomic %, as proposed by the present invention, there is no problem in terms of device characteristic uniformity even if the uncrystallized region remains a little so long as the uncrystallized region is crystallized through the subsequent heat treatment.

The mechanism of the occurrence of the above phenomenon is not clearly discovered. Although conjectural, the following mechanism can be considered. The catalytic element has already been diffused in a metal state in the amorphous silicon film before the crystallization (during temperature increase) of the amorphous silicon film. The catalytic element in the metal state causes reaction in the amorphous silicon film to form a silicide. In the silicified location, the crystallization of the amorphous silicon film progresses. The crystallization will be described depending on cases in which the hydrogen concentration is low and is high.

If the hydrogen concentration in the amorphous silicon film is low, taking the state of occurrence of the crystalline nucleus in the amorphous silicon film into consideration, the added catalytic element moves in the amorphous silicon film to cause crystallization, and therefore, aggregates in excess of a specified amount are formed in spots here and there. Then, each of these aggregates becomes a nucleus to form a gigantic crystal grain. Therefore, almost no catalytic element exists between the adjoining nuclei, and no new nucleus occurs there.

If the hydrogen concentration in the amorphous silicon film is high, it is presumed that hydrogen is preventing the movement of the catalytic element. Consequently, the catalytic element contributes to the crystallization in the originally added state without movement. As a result, crystalline nuclei uniformly occur in the amorphous silicon film, and minute crystal particles are uniformly formed without growing large since the quantity of catalytic element in each crystalline nucleus is small.

Therefore, as described above, in order to achieve the objects of the present invention, the hydrogen concentration in the amorphous silicon film that contains hydrogen is required to be not lower than 3 atomic %. In contrast to this, the upper limit of the hydrogen concentration is based at least on the condition that the film exfoliation of the silicon film should not be caused by the release of a large amount of hydrogen from the silicon film through the heat treatment for the crystallization of the amorphous silicon film. From this point of view, the hydrogen concentration should preferably be not higher than 25 atomic %. Therefore, by setting the hydrogen concentration in the amorphous silicon film within a range of 3 to 25 atomic %, the occurrence of crystalline nuclei such that minute crystal particles are uniformly formed is caused to allow the characteristic variation of the thin film transistor to be more surely reduced. If the hydrogen concentration in the amorphous silicon film is lower than 3 atomic %, then it is sometimes the case where a gigantic crystal grain is formed and a thin film transistor is fabricated across the grain boundary, causing the characteristic variation of the thin film transistors. If the hydrogen concentration in the amorphous silicon film exceeds 25 atomic %, then the film exfoliation is caused by the release of a large amount of hydrogen from the silicon film, exerting a bad influence on the device characteristics of the thin film transistors.

In one embodiment of the present invention, the amorphous silicon film is formed by a plasma CVD method at a heating temperature of not higher than 400° C.

According to the semiconductor device fabricating method of the embodiment, by forming an amorphous silicon film at a heating temperature of not higher than 400° C. by the plasma CVD method, the hydrogen concentration in the amorphous silicon film can be formed roughly uniformly within the aforementioned specified range, and this allows the method to be applied also to a large-area substrate with good repeoducibility.

In one embodiment of the present invention, the element of nickel is used as the catalytic element.

According to the semiconductor device fabricating method of the embodiment, it has been discovered that a crystallization promoting effect can be produced with a trace quantity of one sort or a plurality of sorts of the elements of Ni, Co, Pd, Pt, Cu, Ag, Au, In, Sn, Al and Sb and, in particular, the most remarkable crystallization promoting effect can be obtained when nickel (Ni) is employed. The reason for the above can be given by the following model. The element of nickel does not singly effect but produces the crystal growth effect by being silicified through bonding with the amorphous silicon film. The crystalline structure in the above stage effects as a sort of mold when the amorphous silicon film is crystallized, promoting the crystallization of the amorphous silicon film. The element of nickel forms a silicide of $NiSi_2$ reacting with two silicon (Si) elements. This $NiSi_2$ has a fluorite type crystal structure, and the crystalline structure bears a close resemblance to the diamond structure of single crystal silicon. Furthermore, the aforementioned $NiSi_2$ has a lattice constant of 5.406 Å, which is very close to the lattice constant of 5.430 Å of the diamond structure of the crystal silicon. Therefore, the aforementioned $NiSi_2$ is the ultimate one as a mold for crystallizing the amorphous silicon film and able to mostly promote the crystallization of the amorphous silicon film.

In one embodiment of the present invention, after the addition of the element of nickel to the surface of the amorphous silicon film or the surface of the substrate, the nickel concentration of the surface is within a range of $1 \times 10^{12}$ to $5 \times 10^{13}$ atoms/cm According to the semiconductor device fabricating method of the embodiment, it has been discovered that setting the nickel concentration on the surface to $1 \times 10^{12}$ to $5\times10^{13}$ atoms/cm$^2$ after the addition of nickel to the surface of the amorphous silicon film or the surface of the substrate is preferable in forming a silicon film of satisfactory crystallinity.

If the nickel-concentration is lower than $1\times10^{12}$ atoms/cm$^2$, then the amorphous silicon film is not crystallized since the minimum concentration that causes the crystallization is not lower than $1\times10^{12}$ atoms/cm$^2$.

If the nickel concentration exceeds $5\times10^{13}$ atoms/cm$^2$, then the influence of nickel remaining in the grain boundaries increases to exert a bad influence on the semiconductor characteristics. Specifically, the leak current in the turning-off stage increases in the thin film transistor, and this causes the characteristic variations of the thin film transistors.

In one embodiment of the present invention, the process for adding the element of nickel to the surface of the amorphous silicon film or the surface of the substrate is performed by spin coating a nickel solution on the surface of the amorphous silicon film or the surface of the substrate.

According to the semiconductor device fabricating method of the embodiment, the method of spin coating a nickel solution on the surface of the amorphous silicon film or the surface of the substrate is effective as a method for adding the element of nickel to the surface of the amorphous silicon film or the surface of the substrate.

According to this method, by performing spin coating with a solution in which nickel is dissolved, the nickel concentration in the solution is controlled to enable the trace quantity control of nickel to be introduced into the surface of the amorphous silicon film or the surface of the substrate.

In the solution in which nickel is dissolved according to the above method, it is preferable to employ acetate or nitrate of nickel as a solute and employ an alcohol-based material of ethanol or isopropyl alcohol (IPA) as a solvent. By employing a solution constructed of the above solute and solvent, a stabilized crystal growth can be obtained on the entire surface of the amorphous silicon film. Particularly on a large-size substrate of a liquid crystal display device or the like, excellent film quality can be obtained with uniformity throughout the entire substrate surface.

In one embodiment of the present invention, the process for adding the element of nickel to the surface of the amorphous silicon film or the surface of the substrate is performed by DC sputtering the element of nickel at a low voltage.

According to the semiconductor device fabricating method of the embodiment, by adding nickel to the surface of the amorphous silicon film or the surface of the substrate by DC sputtering at a low voltage, very good uniformity is obtained and particles and the like scarcely cause the non-uniformity of crystal growth although the method is inferior to the spin coating method in terms of trace control at a low concentration.

The reason why the term of "addition" is intentionally used instead of "film formation" is that the sputtering is performed by such a trace quantity that it is insufficient for film formation.

In one embodiment of the present invention, the heating process for crystallizing the amorphous silicon film has a first step for releasing excessive hydrogen existing in the amorphous silicon film and a second step intended for crystal growth of the amorphous silicon film.

According to the semiconductor device fabricating method of the embodiment, the heat treatment for crystallizing the amorphous silicon film containing hydrogen should preferably be performed in the two steps of the first-step heat treatment for releasing the excessive hydrogen existing in the amorphous silicon film and the second-step heat treatment intended for the crystal growth in the amorphous silicon film. This is because the above arrangement allows the elimination of film exfoliation that might occur when the heat treatment intended for the achievement of crystallization is abruptly performed, by performing the first-step heat treatment and thereafter performing the second-step heat treatment intended for crystallization.

In this case, the crystallization performed by extracting hydrogen from the amorphous silicon film seems to be contradictory to the purport of the present invention. However, the hydrogen concentration in the amorphous silicon film in the catalytic element adding stage is important according to the present invention, and the dehydrogenating process performed after the catalytic element addition does not matter. Although the reasons for the above have not been clearly discovered, there has been obtained the reality that the dehydrogenating process performed after the catalytic element addition does not matter also through experiments.

In one embodiment of the present invention, the heating process of the first step is performed within a temperature range of 450° C. to 530° C., and the heating process of the second step is performed within a temperature range of 530° C. to 650° C.

According to the semiconductor device fabricating method of the embodiment, the first-step heat treatment should preferably be performed within the temperature range of 450° C. to 530° C. in reducing the hydrogen concentration in the amorphous silicon film. The above is because the temperature range of 400 to 450° C. is the boundary considered from the energy of bonding of hydrogen to silicon and also from the experimental evidence, and the effective dehydrogenating effect can be practically obtained only at a temperature of not lower than 450° C. That is, if the first-step heat treatment is performed at a temperature lower than 450° C., then no effective dehydrogenating effect can be obtained on the amorphous silicon film containing hydrogen. If the heat treatment temperature in the first step becomes higher than 530° C., then the dehydrogenation rate is increased, as a consequence of which the film exfoliation of the silicon film tends to easily occur. Furthermore, if the heat treatment temperature in the first step becomes higher than 530° C., then the crystallization of the amorphous silicon film is started by the effect of the catalytic element, and therefore, the temperature in the first step is required to be not higher than 530° C. Therefore, the hydrogen in the amorphous silicon film is required to be released slowly and sufficiently through the first-step heat treatment.

The second-step heat treatment should preferably be performed within the temperature range of 530° C. to 650° C. in crystallizing the amorphous silicon film. The temperature that causes the crystallization of the amorphous silicon film is required to be not lower than 530° C. That is, if the temperature in the second step is lower than 530° C., then the amorphous silicon film cannot be crystallized. However, if the temperature is excessively high, then the crystallization rate is so fast that the crystal defects of dislocation and the like frequently occur. Therefore, the upper limit of the temperature in the second step becomes about 650° C. That is, if the heating temperature in the second step exceeds 650° C., then the crystal defects of dislocation and the like frequently occur.

In one embodiment of the present invention, the semiconductor device fabricating method further comprises a process, which is to be performed after the crystallization of the amorphous silicon film through heat treatment, for moving most of the catalytic element remaining in the crystallized silicon film toward a region outside a region in which a semiconductor element is to be formed.

The semiconductor device fabricating method of the present invention is considerably characterized in that the amorphous silicon film is crystallized by the catalytic element. However, even with a trace quantity of addition, the existence of such a metal element in the semiconductor film itself is unfavorable.

Therefore, the semiconductor device fabricating method of the embodiment prevent the catalytic element from exerting a bad influence on the semiconductor element with the provision of the process for moving most of the catalytic element remaining in the silicon film to a region other than the semiconductor element forming region after the catalytic element is utilized for the crystallization process of the amorphous silicon film.

In one embodiment of the present invention, the semiconductor device fabricating method further comprises a process, which is to be performed after the crystallization of the amorphous silicon film through heat treatment, for further promoting the crystallinity of the silicon film by applying laser light to the crystallized silicon film.

According to the semiconductor device fabricating method of the embodiment, the method of crystallizing the amorphous silicon film containing hydrogen through heat treatment and thereafter further promoting the crystallinity of the silicon film by the application of laser light to the crystallized silicon film is effective as a method for improving the semiconductor device performance or, in particular, the current drive ability by improving the crystallinity of the silicon film crystallized by the catalytic element. The reasons for the above will be described below.

When intense light of laser or the like is applied to the crystallized silicon film, the grain boundaries are intensively processed due to the difference in melting point between the crystalline silicon film and the amorphous silicon film. However, in the crystalline silicon film formed by the normal solid phase epitaxy method, the crystalline structure is in the twin crystal state, and therefore, the inside of the crystal grain remains as a twin crystal defect after the application of intense light. In contrast to the above, the crystalline silicon film crystallized by the catalytic element is formed of columnar crystals, and the inside of the crystalline silicon film is in a single crystal state. Therefore, if the grain boundaries are processed by the application of intense light, then a crystalline silicon film of a good quality close to the single crystal state throughout the entire surface is obtained. That is, the method of crystallizing the amorphous silicon film containing hydrogen through heat treatment and thereafter further promoting the crystallinity of the silicon film by the application of laser light to the crystallized silicon film is very effective in terms of crystallinity. Laser light is applied to the silicon film that originally has crystallinity, and therefore, variation in laser light application is largely alleviated in contrast to the method of performing crystallization by directly applying laser light to the amorphous silicon film, causing no problem about uniformity.

The laser light to be used in this stage has a very high absorption coefficient with respect to the silicon film so long as the wavelength is not longer than 400 nm, allowing only the silicon film to be instantaneously heated without giving any thermal damage to the substrate of glass or the like. In particular, the XeCl excimer laser having a wavelength of 308 nm has a great output. Therefore, the beam size at the time of application to the substrate can be increased, and this allows the laser to easily cope with a large-area substrate. The output is relatively stabilized, which is desirable for the application to a mass-production apparatus. By applying the above-mentioned laser light to the surface of the silicon film in a manner that the radiation energy density of the laser light becomes 200 to 450 mJ/cm$^2$, the crystallinity of the silicon film crystallized by the catalytic element is promoted to allow a crystalline silicon film of a very high quality to be obtained. If the radiation energy density of the laser light is smaller than 200 mJ/cm$^2$, then the silicon film is scarcely melted, as a consequence of which the promotion of crystallinity cannot sufficiently be achieved. If the radiation energy density is greater than 450 mJ/cm$^2$, then the crystallinity obtained by the catalytic element is completely lost or reset, causing the problem of nonuniformity observed in the conventional laser crystallization.

In one embodiment of the present invention, the semiconductor device fabricating method further comprises a process, which is to be performed after the crystallization of the amorphous silicon film through heat treatment, for further promoting the crystallinity of the silicon film by subjecting the crystallized silicon film to heat treatment at an elevated temperature higher than the heat treatment temperature in an oxidizing atmosphere.

According to the semiconductor device fabricating method of the embodiment, the method of crystallizing the amorphous silicon film containing hydrogen through heat treatment and thereafter further promoting the crystallinity by performing heat treatment in an oxidizing atmosphere at a temperature higher than the heat treatment temperature is also effective as another method for improving the crystallinity of the silicon film crystallized by the catalytic element to further improve the performance, or, in particular, the current drive ability of the semiconductor device. If the silicon film crystallized by the catalytic element is subjected to heat treatment in an oxidizing atmosphere at a high-temperature (for example, 800° C. to 1100° C.), then over-saturated Si atoms caused by the oxidizing operation are supplied to the silicon film. As a result, the oversaturated Si atoms enter the crystal defects (in particular, dangling bond) in the silicon film, allowing the defects to be removed. Therefore, the density of defects in the silicon film crystallized by the catalytic element is remarkably reduced and the mobility is remarkably improved, allowing the semiconductor device performance to be remarkably improved.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
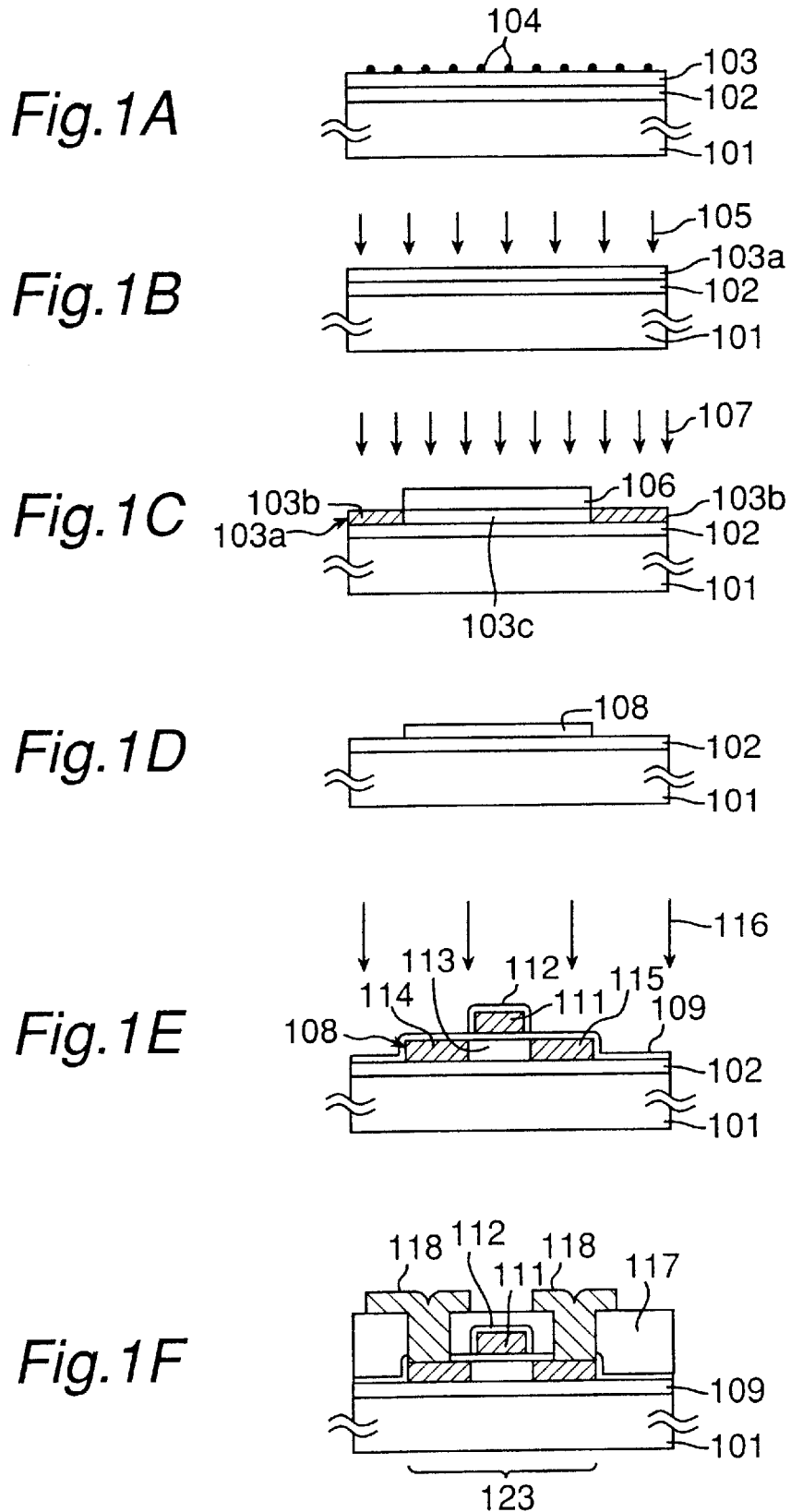
FIGS. 1A through 1F are views showing a method for fabricating a semiconductor device according to a first embodiment of the present invention.

The semiconductor device and the method for fabricating the device of the present invention will be described in detail below on the basis of the embodiments thereof shown in the drawings.

FIRST EMBODIMENT

The semiconductor device and the method for fabricating the device of the first embodiment of the present invention will be described. According to this first embodiment, the present invention is applied to a process for fabricating an n-type TFT on a glass substrate. The n-type TFT of the present embodiment can also be used for the driver circuit and the pixel portion of an active matrix type liquid crystal display device and as elements that constitute a thin film integrated circuit. Accordingly, the present embodiment will be described taking a TFT for driving the pixels of an LCD active matrix substrate, on which several hundreds of thousands to several millions of n-type TFT's are required to be uniformly formed, as an example.

FIGS. 1A through 1F are views showing the processes for fabricating pixel drive use TFT's of an active matrix substrate of the first embodiment. The fabricating processes proceed in the order of FIG. 1A to FIG. 1E. FIG. 2 to FIG. 6 are plan views showing the outline of the TFT fabricating processes. Although the LCD practically includes more than several hundreds of thousands of TFT's as described above, the description is provided simply on the basis of 12 TFT's arranged in three rows by four columns in FIG. 2.

The TFT's are fabricated as follows.

(1) First, as shown in FIG. 1A, a groundwork film 102 made of silicon oxide having a thickness of 300 to 500 nm is formed on a glass substrate 101 by, for example, the sputtering method. This groundwork film 102 is provided for preventing the diffusion of impurities from the glass substrate 101.

(2) Next, a substrate heating temperature is preferably set to a temperature of not higher than 400° C. or, for example, 300° C., and an intrinsic (I type) amorphous silicon (a-Si) film 103 having a thickness of 20 to 80 nm or, for example, 30 nm is formed by the plasma CVD method.

In detail, a diode parallel plate plasma enhanced CVD system is used as an apparatus, and $SiH_4$ gas and $H_2$ gas are used as material gases. Then, the a-Si film 103 is formed by setting the power density of an RF power (Radio Frequency Power) to a low value of 10 to 100 $mW/cm^2$ or, for example, 80 $mW/cm^2$ and setting the deposition rate to about 50 nm/min. This a-Si film 103 has a hydrogen concentration of 10 to 15 atomic %. Since the hydrogen concentration in this a-Si film 103 is within a range of 10 to 15 atomic %, there is caused the occurrence of crystalline nuclei such that minute crystal particles are uniformly formed, allowing a silicon film of satisfactory crystallinity to be fabricated. If the hydrogen concentration in the a-Si film 103 is lower than 3 atomic %, then a gigantic crystal grain is formed through subsequent heat treatment, and characteristic variations of TFT's to be formed with a silicon film obtained by crystallizing this a-Si film 103 used as an active region increase. If the hydrogen concentration in the a-Si film 103 exceeds 25 atomic % and the a-Si film 103 is subjected to heat treatment, then a large amount of hydrogen is released from the silicon film to cause film exfoliation, exerting a bad influence on the TFT element characteristics.

As described above, by forming the a-Si film 103 by the plasma CVD method at a heating temperature of not higher than 400° C., the hydrogen concentration in the a-Si film 103 can be roughly uniformly formed at a concentration of 10 to 15 atomic %, also allowing the device to be applied to a large-area substrate with satisfactory reproducibility.

(3) Next, a trace quantity of nickel 104 is added to the surface of the a-Si film 103 by a spinner. The addition of the trace quantity of nickel 104 is performed by retaining a solution in which nickel is dissolved on the a-Si film 103 and uniformly spreading and drying the solution on the glass substrate 101 by the spinner. By using nickel acetate as the solute of the solution and using ethanol as a solvent, the nickel concentration in the solution consisting of the solute and the solvent was adjusted to 2 ppm. As described above, if the solution in which nickel is dissolved is used and spin coated on the a-Si film 103, the quantity of nickel 104 to be introduced into the surface of the a-Si film 103 can be controlled to a trace quantity by controlling the nickel concentration in the solution.

The concentration of nickel thus added to the surface of the a-Si film 103 was measured by the total reflection X-ray fluorescence (TRXRF) method, and the resulting value was about $8 \times 10^{12}$ $atoms/cm^2$. The nickel concentration is desirable in forming a silicon film of satisfactory crystallinity. If the nickel concentration is lower than $1 \times 10^{12}$ $atoms/cm^2$, then the a-Si film 103 is not crystallized since the minimum concentration that causes crystallization is not lower than $1 \times 10^{12}$ $atoms/cm^2$. If the nickel concentration exceeds $5 \times 10^{13}$ $atoms/cm^2$, then the influence of nickel remaining in the grain boundaries increases to exert a bad influence on the semiconductor element characteristics. Specifically, a leak current in the turning-off operation of the thin film transistor increases to cause variations in TFT characteristics.

(4) Next, the first-step heat treatment is performed for one to two hours at a temperature of 450 to 530° C. in an inert atmosphere of, for example, a nitrogen atmosphere to release excessive hydrogen from the a-Si film 103, and thereafter the second-step heat treatment is performed for two to eight hours at a temperature of 530 to 650° C. to crystallize the a-Si film 103. In the present embodiment, the first-step heat treatment is performed for one hour at a temperature of 500° C., as an example, and thereafter the second-step heat treatment is performed for four hours at a temperature of 570° C. During the first-step and second-step heat treatment, the nickel 104 added to the surface of the a-Si film 103 is silicified, and the crystallization of the a-Si film 103 progresses with the silicified nickel 104 serving as nuclei, as a consequence of which a crystalline silicon film 103a as shown in FIG. 1B is formed. The crystalline silicon film 103a formed in this stage had a mean crystal grain size of about 1 to 1.5 µm. The characteristic variations of the TFT's that employ the crystalline silicon film 103a having the above-mentioned crystal grain size as the active region are reduced.

As described above, by performing the second-step heat treatment intended for crystallization after the first-step heat treatment, the film exfoliation that might occur when the heat treatment intended for crystallization is abruptly performed can be eliminated.

The first-step heat treatment is performed within the temperature range of 450° C. to 530° C., and therefore, the hydrogen concentration in the a-Si film 103 is reduced to allow an effective dehydrogenation effect to be obtained. In this stage, no effective dehydrogenation effect can be obtained when the first-step heat treatment temperature is lower than 450° C., and the film exfoliation easily occurs when the first-step heat treatment temperature is higher than 530° C.

The second-step heat treatment is performed within the temperature range of 530° C. to 650° C., which is desirable in crystallizing the a-Si film 103. The a-Si film 103 cannot be crystallized when the second-step heat treatment temperature is lower than 530° C., and the crystal defects of transformation and the like frequently occur when the second-step heat treatment temperature exceeds 650° C.

(5) Subsequently, as shown in FIG. 1B, laser light 105 is applied to the crystalline silicon film 103a in order to promote the crystallinity of the crystalline silicon film 103a. This laser light 105 is emitted from the XeCl excimer laser (wavelength: 308 nm, pulse width: 40 nsec). In this stage, the condition of application of the laser light 105 is set so that the glass substrate 101 is heated to a temperature of 200 to 450° C. or, for example, 400° C. at the time of laser application, so that laser light of a radiation energy density of 250 to 450 mJ/cm$^2$ or, for example, 350 mJ/cm$^2$ is applied. The laser light 105 was formed so that the beam size on the surface of the glass substrate 101 came to have an elongated rectangular shape of 150 mm×1 mm, and sequential scanning was performed at a step width of 0.05 mm in the direction of the shorter side. That is, laser application is performed by a total of 20 times at an arbitrary point of the crystalline silicon film 103a.

As described above, by applying the laser light to the crystalline silicon film 103a crystallized through the first-step and second-step heat treatment, the crystallinity can be further promoted. That is, in terms of crystallinity, the effectiveness of this method is very high. Furthermore, the laser light is applied to the crystalline silicon film 103a that originally has crystallinity, and therefore, the variation of laser application is largely alleviated to provide good uniformity.

(6) Next, as shown in FIG. 1C, an insulating film of a silicon oxide film or a silicon nitride film is deposited on the crystalline silicon film 103a, and the insulating film is patterned to form a mask 106. Then, the glass substrate 101 is doped with ions of phosphorus 107 from above.

Figure 2:
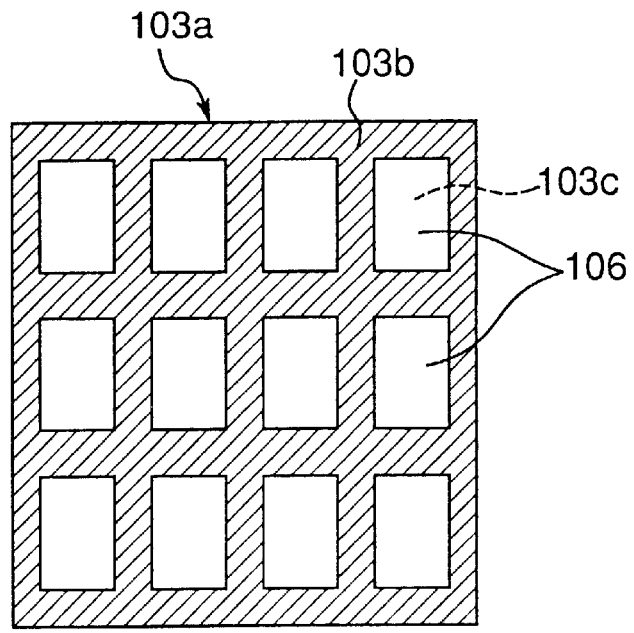
FIG. 2 is a plan view showing the outline of a fabricating process of the above semiconductor device.

In detail, the mask 106 of the present embodiment is formed by patterning the silicon oxide film. The silicon oxide film is formed by employing TEOS (Tetra Ethoxy Ortho Silicate) as a material and resolving and depositing the TEOS material together with oxygen by the RF (Radio Frequency) plasma CVD method. The thus-formed mask 106 should preferably have a thickness of 10 to 400 nm, and the thickness of the mask 106 is set to 150 nm in the present embodiment. If the state in this stage is viewed from above the glass substrate 101, then, as shown in FIG. 2, the crystalline silicon film 103a is partially masked in an island-like shape by the mask 106. There are existing a region 103b that is not covered with the mask 106 and a region 103c covered with the mask 106. In this state, as shown in FIG. 1C, the glass substrate 101 is doped from above with ions of phosphorus 107 under the doping conditions of an acceleration voltage of 5 to 10 kV and a dose quantity of 5×10$^{15}$ to 1×10$^{16}$ cm$^{-2}$. As a result, the phosphorus 107 is implanted into the region 103b of the exposed crystalline silicon film 103a, while the region 103c that belongs to the crystalline silicon film 103a and is covered with the mask 106 is not doped with phosphorus 107.

Figure 3:
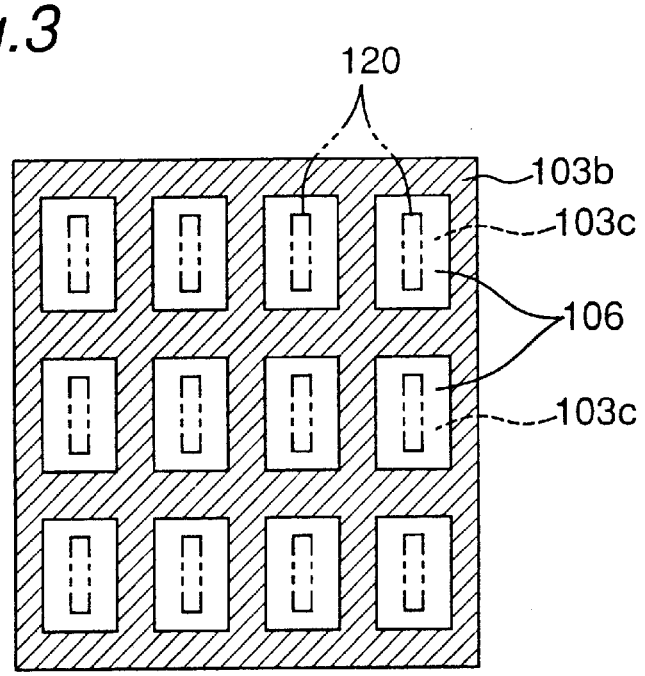
FIG. 3 is a plan view showing the outline of a fabricating process of the above semiconductor device.

In order to make clear the relation between a later TFT element region 120, the region 103c that belongs to the crystalline silicon film 103a and is covered with the mask 106 and the region 103b that belongs to the crystalline silicon film 103a and is doped with phosphorus, a crystalline silicon film 108 in which the TFT active region is lately formed is shown in FIG. 3. As shown in FIG. 3, the TFT element region 120 is completely covered with the mask 106 in this stage.

(7) Next, the crystalline silicon film 103a shown in FIG. 1C is subjected to heat treatment at a temperature of 580 to 700° C. for several hours to several tens of hours in an inert atmosphere of, for example, a nitrogen atmosphere. In the present embodiment, as an example, heat treatment is performed at a temperature of 600° C. for 12 hours. Through this heat treatment, the phosphorus in the region 103b attracts nickel diffused in the region 103c.

As a result, the nickel concentration in the region 103c is remarkably reduced to allow the prevention of the bad influence of the nickel exerted on the semiconductor device. In this stage, the nickel concentration in the actual region 103c was measured by the secondary-ion mass spectrometry (SIMS) method, and the nickel concentration was reduced to about 5×10$^{16}$ atoms/cm$^3$. The nickel concentration in the region 103c before performing the heat treatment was about 5×10$^{17}$ to 1×10$^{18}$ atoms/cm$^3$.

As described above, since the concentration of the catalytic element in the region 103c is within a range of 1×10$^{16}$ to 1×10$^1$ atoms/cm$^3$, and therefore, a silicon film of good crystallinity can be formed. If the concentration of the catalytic element is lower than 1×10$^{16}$ atoms/cm$^3$ in the region 103c of the crystalline silicon film 103a, then no sufficient crystal growth is obtained. If the concentration of the catalytic element is higher than 1×10$^{18}$ atoms/cm$^3$ in the region 103c, then an increase in leak current or the like occurs.

Figure 4:
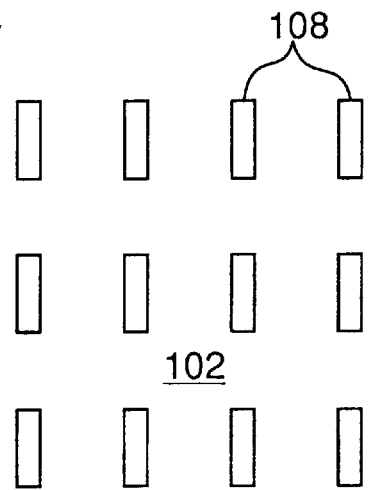
FIG. 4 is a plan view showing the outline of a fabricating process of the above semiconductor device.

(8) Next, the silicon oxide film, i.e., the mask 106 is removed by etching. The removal of the mask 106 is performed by using 1:10 buffered hydrofluoric acid (BHF) that has sufficient selectivity to the lower layer of the crystalline silicon film 103a as an etchant in a wet etching manner. Subsequently, an unnecessary portion of the crystalline silicon film 103a is removed to form a crystalline silicon film 108 (corresponding to the TFT element region 120 shown in FIG. 3) as shown in FIG. 1D. This crystalline silicon film 108 is constructed of part of the region 103c shown in FIG. 1C, and the crystalline silicon film 108 is to subsequently constitute the TFT active regions (source/drain region and channel region) If the state in this stage is viewed from above, then the crystalline silicon film 108 is formed in an island-like shape on the groundwork film 102, as shown in FIG. 4.

(9) Next, as shown in FIG. 1E, a silicon oxide film having a thickness of 20 to 150 nm or 100 nm in this case is formed as a gate insulating film 109 so as to cover the crystalline silicon film 108 that serves as the active region. The gate insulating film 109 that is the silicon oxide film is formed by employing TEOS as a material and resolving and depositing the TEOS material together with oxygen by the RF plasma CVD method at a substrate temperature of 150 to 600° C. or preferably 300 to 450° C. The gate insulating film 109 may be otherwise formed by employing TEOS as a material and using ozone gas according to the low pressure CVD method or the atmospheric pressure CVD method at a substrate temperature of 350 to 600° C. or preferably 400 to 550° C.

Then, in order to improve the characteristics of the bulk of the gate insulating film 109 itself and the characteristics of an interface between the crystalline silicon film 108 and the gate insulating film 109 after the formation of the gate insulating film 109, annealing is performed at a temperature of 400 to 600° C. for one to four hours in an inert gas atmosphere.

Figure 5:
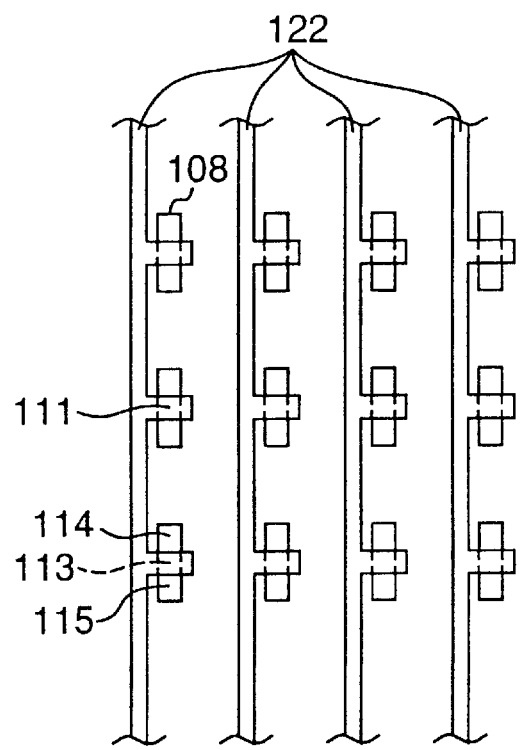
FIG. 5 is a plan view showing the outline of a fabricating process of the above semiconductor device.

(10) Subsequently, an aluminum film having a thickness of 400 to 800 nm or, for example, 600 nm is formed by the sputtering method. Then, the aluminum film is patterned to form a gate electrode 111. As shown in FIG. 5, this gate electrode 111 concurrently constitutes a gate bus line 122 in terms of plane.

As shown in FIG. 1E, an oxide layer 112 is formed by anodically oxidizing the surface of the patterned aluminum film. This anodic oxidation is performed in an ethylene glycol solution containing one to five percent of tartaric acid initially with a voltage raised to 220 V at a constant current. The above state is retained for one hour and then the oxidation ends. The thus-obtained oxide layer 112 has a thickness of 200 nm. The oxide layer 112 comes to have a thickness for the formation of an offset gate region in the subsequent ion doping process, and therefore, the length of the offset gate region can be determined by the anodic oxidation process.

(11) Next, using the gate electrode 111 and the oxide layer 112 located around it as a mask, an impurity (phosphorus) is implanted into the active region by the ion doping method. In this stage, phosphine ($PH_3$) is used as a doping gas, and the ion doping is performed by setting the acceleration voltage to 60 to 90 kV or, for example, 80 kV with a dose of $1 \times 10^{15}$ to $8 \times 10^{15}$ $cm^{-2}$ or, for example, $2 \times 10^{15}$ $cm^{-2}$. Through this ion doping process, the regions 114 and 115 that belong to the crystalline silicon film 108 and are doped with the impurity subsequently become the TFT source/drain region, while the region 113 that is masked by the gate electrode 111 and the oxide layer 112 located around it and is doped with no impurity becomes the TFT channel region. The size of the region 113 is greater than the size of the crystal grain that constitutes this region 113.

(12) Subsequently, annealing is performed by applying laser light 116 to activate the implanted impurity ions and concurrently improve the crystallinity of the portion of which the crystallinity has been degraded through the impurity introducing process. The XeCl excimer laser (wavelength: 308 nm, pulse width: 40 nsec) is used as a laser in this stage, and the application of laser light 116 is performed with the radiation energy density set to 150 to 400 $mJ/cm^2$ (preferably 200 to 250 $mJ/cm^2$). The thus-formed regions 114 and 115 doped with the n-type impurity (phosphorus) had a sheet resistance of 200 to 800 $\Omega/\square$.

(13) Subsequently, as shown in FIG. 1F, a silicon oxide film or a silicon nitride film having a thickness of about 600 nm is formed as an interlayer insulating film 117. If a silicon oxide film is used as the interlayer insulating film 117, a satisfactory interlayer insulating film 117 having an excellent step coverage property can be obtained if the film is formed by the plasma CVD method using TEOS and oxygen as materials or by the low-pressure CVD method or the atmospheric pressure CVD method using TEOS and ozone as materials. If a silicon nitride film formed by the plasma CVD method using $SiH_4$ and $NH_3$ as material gases for the interlayer insulating film 117, then there can be obtained the effects of supplying hydrogen atoms to the interface between the active region and the gate insulating film 109 and reducing the dangling bond that deteriorates the TFT characteristics.

Figure 6:
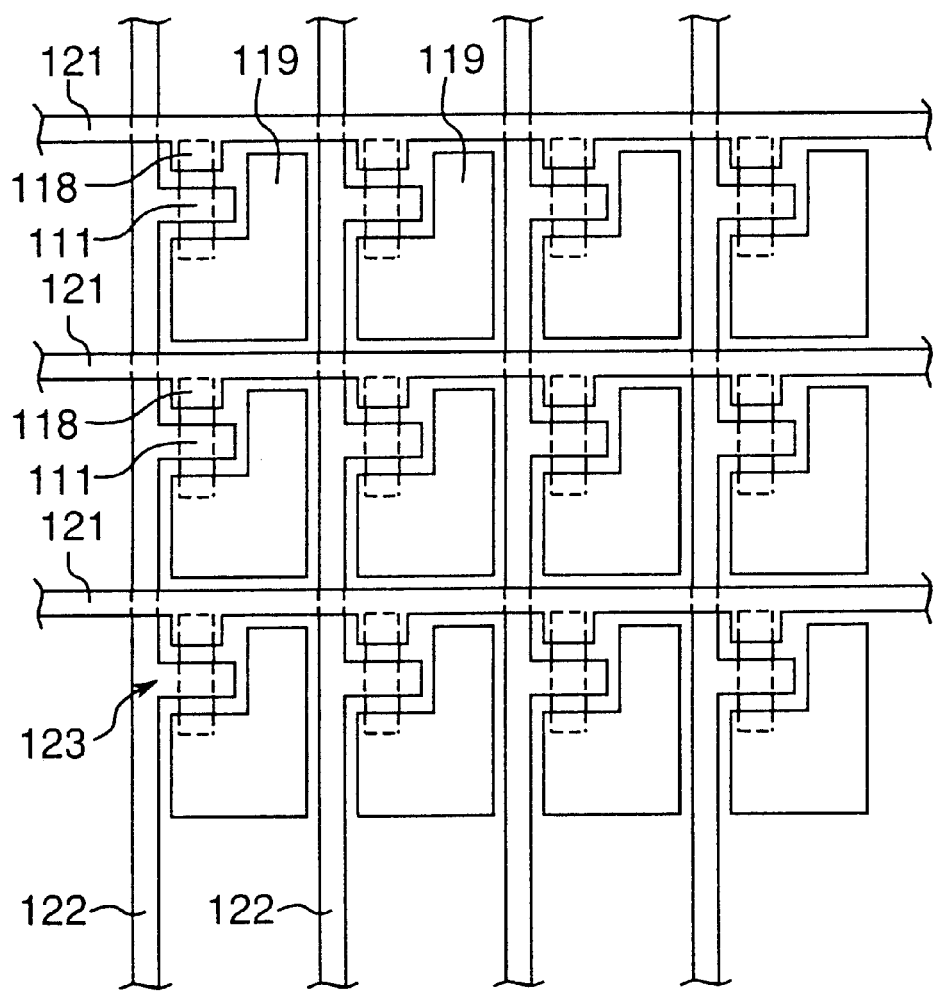
FIG. 6 is a plan view showing the outline of a fabricating process of the above semiconductor device.

(14) Next, a contact hole is formed through the interlayer insulating film 117, and a source electrode 118 and a pixel electrode 119 are formed. The source electrode 118 is formed of a bilayer of metal materials of, for example, titanium nitride and aluminum. This titanium nitride film is provided as a barrier film for preventing aluminum from diffusing into the semiconductor layer. As shown in FIG. 6, a source bus line 121 is formed in the same layer as that of the source electrode 118, while a gate bus line 122 is formed in the same layer as that of the gate electrode 111. A video signal is supplied to the source electrode 118 via the source bus line 121, and necessary electric charges are written into the pixel electrode 119 on the basis of the gate signal of the gate bus line 122. This pixel electrode 119 is formed of a transparent conductive film of ITO or the like.

(15) Finally, annealing is performed at a temperature of 350° C. for one hour in a hydrogen atmosphere at 1 atm, completing a TFT 123 as shown in FIG. 1F and FIG. 6. Further, as the need arises, a protecting film constructed of a silicon nitride film or the like may be formed on the TFT 123 for the purpose of protecting the TFT 123.

The TFT 123 fabricated according to the first embodiment had excellent characteristic variations of about ±10% in terms of field effect mobility and about ±0.2 V in terms of threshold voltage in spite of the very high performance of about 130 $cm^2/Vs$ in terms of field effect mobility and about 2 V in terms of threshold voltage. The measurement results are the results of measurement at 30 points inside the glass substrate using a glass substrate of a size of 400×320 mm as the glass substrate 101. In contrast to this, the TFT fabricated by the conventional method has a large crystal grain size in the active region. Therefore, the mean field effect mobility is about 150 $cm^2/Vs$, which is greater than that of the present invention. However, the TFT has a significant characteristic variation of about ±30% in terms of field effect mobility and a significant variation within a range of 2±0.5 V in terms of threshold voltage.

It was, therefore, discovered that the characteristic variation of the TFT 123 could be largely improved by comparison with the conventional example. Through repetitive measurements and a durability test by means of the bias and temperature stress, almost no characteristic deterioration is observed, meaning that the reliability is much higher than the conventional one. With regard to an increase in leak current in the TFT OFF-state region and characteristic variation due to, in particular, the catalytic element, no abnormality occurred and the leak current could be reduced to about several picoamperes equivalent to the leak current occurring in the case where no catalytic element was employed, by which the yield of fabrication could be remarkably improved.

An LCD panel was formed by employing the LCD use active matrix substrate fabricated on the basis of this first embodiment and evaluated through actual operation. As a result, an LCD panel that had less unevenness of display than the device fabricated by the conventional method, a very small amount of pixel defects due to TFT leak, a high contrast and a high display quality could be obtained.

Although the first embodiment has been described taking the TFT 123 for driving the pixel of the LCD use active matrix substrate as an example, this TFT 123 can also be simply applied to a thin film integrated circuit and the like. In such a case, it is proper to further form a contact hole on the gate electrode 111 and provide necessary wiring. As described above, the present invention is not limited to the aforementioned embodiment, and a variety of modifications can be achieved on the basis of the technical concept of the present invention.

For example, in the aforementioned first embodiment, the element of nickel is added to the surface of the a-Si film 103 according to the method for introducing nickel. However, nickel may be added to the surface of the glass substrate 101. In this case, the crystal growth occurs from the lower surface side of the amorphous silicon film. That is, the crystal growth of the amorphous silicon film may be made to occur from the upper surface side or from the lower surface side of the amorphous silicon film.

Although the addition of the element of nickel is performed by the spin coating method, the addition may be performed by low-voltage DC sputtering. There can be used a variety of other methods of, for example, a method for forming a thin film by the vapor deposition and plating methods and a method for directly introducing the element of nickel by the ion doping method.

Although nickel is employed as the catalytic element, there may be employed cobalt, palladium, platinum, copper, silver, gold, indium, zinc, aluminum or antimony as an impurity metal element for promoting crystallization besides nickel.

As a means for promoting the crystallinity of the crystalline silicon film, the heating method by the application of XeCl excimer laser, or a pulse laser is used. However, a heating method by means of another laser of, for example, a continuous oscillation Ar laser or the like may be used. Instead of laser light, there may be used infrared light or flash lamp light having an intensity equivalent to that of laser light. That is, the crystallinity may be promoted by the so-called RTA (Rapid Thermal Annealing, also called RTP: Rapid Thermal Processing) for heating a sample by raising the temperature to 1000 to 1200° C. (temperature of silicon monitor) in a short time.

The thin film semiconductor device of the present invention may be applied to, for example, a contact type image sensor, a driver-integrated type thermal head, a driver-integrated type optical writing device or display device employing an organic EL element or the like as a light-emitting element and a three-dimensional IC besides the LCD use active matrix type substrate. In this case, these devices are allowed to have high performance of an increased operating speed, a high resolution and so on.

Second Embodiment

A semiconductor device and a method for fabricating the device according to a second embodiment of the present invention will be described. According to this second embodiment, reference is made to the processes of fabricating on a quartz glass substrate a CMOS structure circuit in which an n-type TFT and a p-type TFT constituting the peripheral drive circuit of an active matrix type liquid crystal display device and a general thin film integrated circuit are complementarily constructed.

Figure 7:
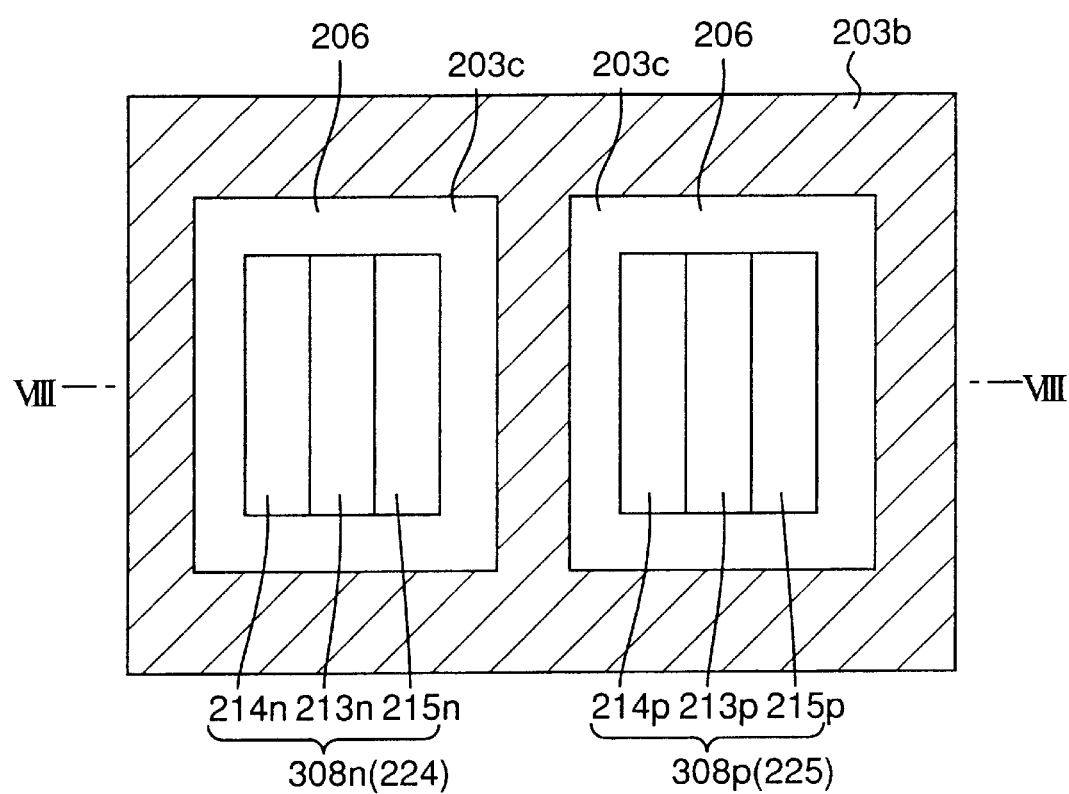
FIG. 7 is a plan view showing the outline of the fabricating process of a semiconductor device according to a second embodiment of the present invention.

FIG. 7 is a plan view showing the outline of a fabricating process of the n-type TFT and the p-type TFT of the CMOS structure circuit of the second embodiment. FIGS. 8A through 8F are sectional views taken along the line VIII—VIII in FIG. 7, where the fabricating processes proceed in the order of FIG. 8A to FIG. 8F. It is to be noted that the description is simply based on TFT's (n-type TFT 224 and p-type TFT 225) arranged in one row by two columns in FIG. 7.

The n-type TFT 224 and the p-type TFT 225 shown in FIG. 7 are fabricated as follows.

Figure 8A:
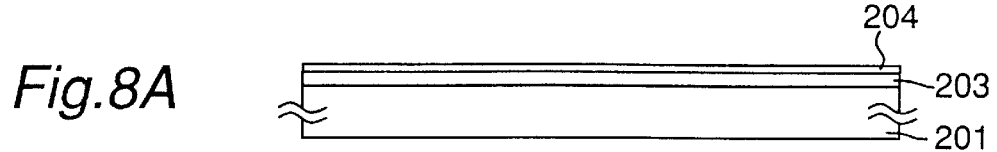
FIGS. 8A through 8F are process charts showing the fabricating method of the above semiconductor device.

(1) First, the surface of a quartz glass substrate 201 shown in FIG. 8A is cleaned by low-concentration hydrofluoric acid, and thereafter, an intrinsic (I type) a-Si film 203 having a thickness of 40 to 100 nm or, for example, 55 nm is formed. The substrate heating temperature in this stage should preferably be not higher than 400° C., and the temperature is 300° C. in the present embodiment. A parallel plate plasma enhanced CVD system was used as an apparatus, and $SiH_4$ gas and $H_2$ gas were used as material gases. Then, the power density of RF power is set to a low value of 10 to 100 mW/cm² or, for example, 80 mW/cm². In this stage, the deposition rate was about 50 nm/min. The thus-obtained a-Si film 203 had a hydrogen concentration of 10 to 15 atomic %.

(2) Next, a trace quantity of nickel 204 is added to the surface of the a-Si film 203. The addition of trace quantity of nickel 204 is performed by the low-voltage DC sputtering.

Specifically, the sputtering process was performed by increasing the substrate conveyance velocity up to 2000 mm/min at a very low DC power of about 20 W. By using argon as a sputtering gas and increasing the gas pressure in the sputtering stage up to more than 10 Pa against a pure nickel target, very low nickel concentration sputtering can be achieved. The element of nickel 204 sputtered under these conditions, shown as a thin film in FIG. 8A, does actually not form even a monatomic layer, which is not permitted to be called the film at all. The concentration of nickel 204 thus added to the surface of the a-Si film 203 was measured by the total reflection X-ray fluorescence (TRXRF) method, and the resulting value was about $1 \times 10^{13}$ atoms/cm².

The nickel 204 is added to the surface of the a-Si film 203 by DC sputtering at a low voltage, and therefore, the nickel 204 can be uniformly added to the surface of the a-Si film 203.

(3) Next, heat treatment is performed in an inert atmosphere of, for example, a nitrogen atmosphere. Through this heat treatment, the first-step heat treatment for dehydrogenating the inside of the a-Si film 203 is performed at a rising temperature, and thereafter the second-step heat treatment is performed at a further elevated temperature to crystallize the a-Si film 203.

Specifically, an annealing process is performed as the first-step heat treatment for one to two hours at a temperature of 450 to 530° C., and the second-step heat treatment is performed for two to eight hours at a temperature of 530 to 650° C. In the present embodiment, as an example, the first-step heat treatment is performed for one hour at a temperature of 500° C., and thereafter, the second-step heat treatment is performed for four hours at a temperature of 600° C. During the heat treatment of the first step and the second step, the nickel 204 added to the surface of the a-Si film 203 is silicified, and the crystallization of the a-Si film 203 progresses using the silicified nickel as nuclei, forming the crystalline silicon film 203a shown in FIG. 8B. The crystalline silicon film 203a formed in this stage had a mean crystal grain size of about 1 μm.

(4) Next, an insulating thin film of a silicon oxide film or a silicon nitride film is deposited on the crystalline silicon film 203a, and the insulating film is patterned to form a mask 206. In the present embodiment, the mask 206 is formed of an silicon oxide film. The silicon oxide film is formed by employing TEOS as a material and resolving and depositing the TEOS material together with oxygen by the RF plasma CVD method. The mask 206 should preferably have a thickness of 100 nm to 400 nm, and the thickness is set to 150 nm in the present embodiment.

(5) Next, the entire surface of the quartz glass substrate 201 is doped with ions of phosphorus 207 from above. The phosphorus 207 is doped under the doping conditions of an acceleration voltage of 5 to 10 kV and dose quantity of $5 \times 10^{15}$ to $1 \times 10^{16}$ cm$^{-2}$. As a result, phosphorus is implanted into the region 203b of the exposed crystalline silicon film 203a. In the meantime, the region 203c that belongs to the crystalline silicon film 203a and is covered with the mask 206 is not doped with phosphorus. In this stage, a TFT active region to be subsequently formed is completely covered with the mask 206.

Figure 8B:
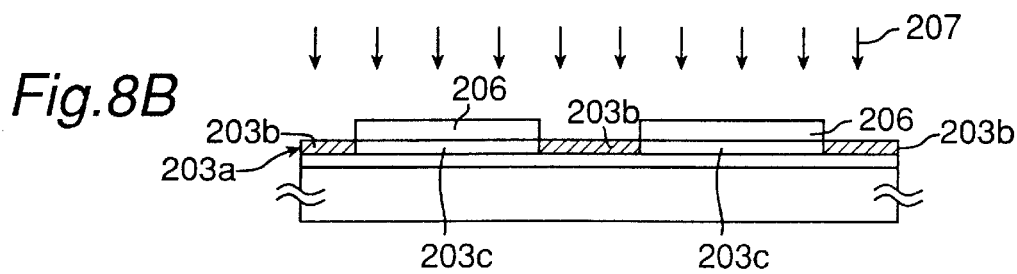

(6) Next, the crystalline silicon film 203a shown in FIG. 8B is subjected to heat treatment at a temperature of 580 to 700° C. for several hours to several tens of hours in an inert atmosphere of, for example, a nitrogen atmosphere. In the present embodiment, as an example, heat treatment was performed at a temperature of 600° C. for 12 hours. Through this heat treatment, the phosphorus in the region 203b of the crystalline silicon film 203a attracts nickel 204 diffused in the region 203c. As a result, the nickel concentration in the region 203c is remarkably reduced. The nickel concentration in the actual region 203c was measured by SIMS, and the nickel concentration was reduced to about $8 \times 10^{16}$ atoms/cm$^3$. The nickel concentration in the region 203c of the crystalline silicon film 203a before performing the heat treatment was about $1 \times 101$ atoms/cm$^3$.

Figure 8C:
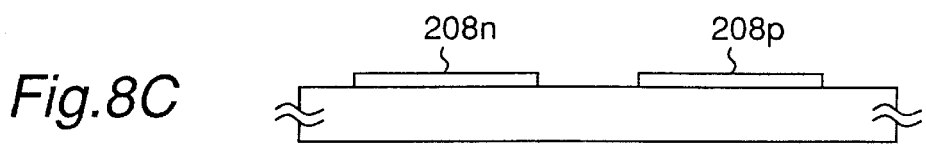

(7) Next, the silicon oxide film, i.e., the mask 206 is removed by etching. The removal of the mask 206 is performed by using 1 : 10 buffered hydrofluoric acid (BHF) that has sufficient selectivity to the lower layer of the crystalline silicon film 203a as an etchant in a wet etching manner. Subsequently, an unnecessary portion of the crystalline silicon film 203a is removed to perform separation between elements. As a result, as shown in FIG. 8C, island-shaped crystalline silicon films 208n and 208p that subsequently become TFT active regions are formed. If the state in this stage is viewed from above the quartz glass substrate 201, then a state as shown in FIG. 7 is provided.

In order to clarify the positional relation between the crystalline silicon films 208p and 208n and regions 203b and 203c, the regions 203b and 203c and the mask 206 are shown. As shown in FIG. 7, the island-shaped crystalline silicon films 208n and 208p that subsequently become the TFT active regions are formed at least in the region 203c.

Figure 8D:
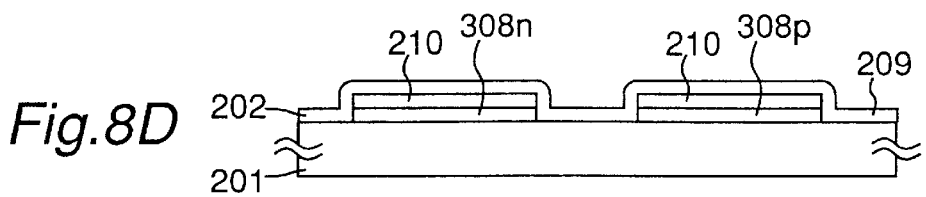
Figure 8E:
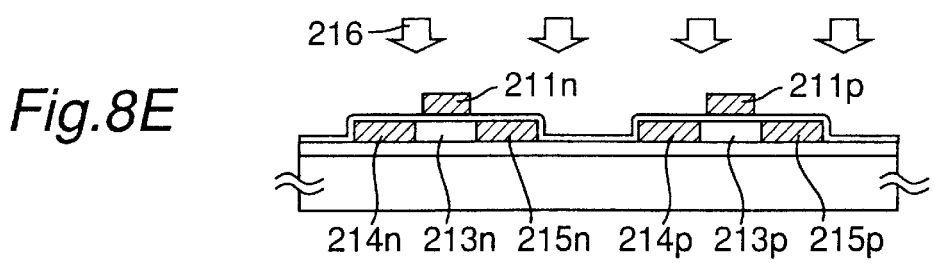

(8) Next, as shown in FIG. 8D, a silicon oxide film is formed as a gate insulating film 209 having a thickness of 60 nm so as to cover the crystalline silicon films 208n and 208p that serve as the active regions. In the present embodiment, the gate insulating film 209 was formed by the low pressure CVD method at a temperature of 850° C. using SiH$_4$ gas and N$_2$O gas as materials. The film is the so-called HTO film.

(9) Next, the crystalline silicon films 208n and 208p are subjected to heat treatment in an oxidizing atmosphere. This oxidizing atmosphere is the oxidizing atmosphere of oxygen, water vapor, HCl or the like, and it is an oxygen atmosphere having a pressure of 1 atm in the present embodiment. The heating temperature should preferably be 850 to 1100° C., and the heat treatment is performed at a temperature of 950° C. in the present embodiment. By performing the heat treatment for two hours and thirty minutes under these conditions, oxygen diffuses and moves through the gate insulating film 209, and the surfaces of the crystalline silicon films 208n and 208p located in the lower layer are oxidized to form an oxide film of about 50 nm on the surfaces of the crystalline silicon films 208n and 208p. As a result, the film thickness of the crystalline silicon films 208n and 208p shown in FIG. 8C is reduced to 30 nm from the initial value of 55 nm, and the crystalline silicon films 208n and 208p become crystalline silicon films 308n and 308p as shown in FIG. 8D. The TFT gate insulating film is constructed of the two layers of an oxide film 209 formed by CVD and an oxide film 210 formed by thermally oxidizing the silicon film 208, and the total film thickness becomes 110 nm. A channel interface is constructed of the crystalline silicon films 308n and 308p located in the active region and the oxide film 210, and a satisfactory interface characteristic is obtained. Further, the dangling bonds in the crystalline silicon films 308n and 308p are remarkably reduced through the oxidizing process, and the crystallinity is remarkably improved. As a result, the region is changed into an active region of a high-quality crystalline silicon film, which is formed into a thin film having a thickness of 30 nm.

(10) Subsequently, as shown in FIG. 4E, an aluminum film (including 0.1 to 2% of silicon) having a thickness of 400 to 800 nm or, for example, 500 nm is formed by the sputtering method. The aluminum film is patterned to form gate electrodes 211n and 211p.

(11) Next, impurities of phosphorus and boron are implanted into the active regions 308n and 308p by the ion doping method using the gate electrodes 211n and 211p as a mask. In this stage, phosphine (PH$_3$) and diborane (B$_2$H$_6$) are used as doping gases. When implanting phosphorus, the acceleration voltage is set to 60 to 90 kV or, for example, 80 kV. When implanting boron, the acceleration voltage is set to 40 to 80 kV or, for example, 65 kV. The dose is set to $1 \times 10^{15}$ to $8 \times 10^{15}$ cm$^{-2}$. The dose of phosphorus is set to, for example, $2 \times 10^{11}$ cm$^{-2}$, and the dose of boron is set to $5 \times 10^{15}$ cm$^{-2}$.

Through this ion doping process, the regions that are doped with no impurity masked with the gate electrodes 211n and 211p subsequently become TFT channel regions 213n and 213p. By covering the region that needs no doping with a photoresist, the exposed regions are doped selectively with the elements of phosphorus and boron to form n-type impurity regions 214n and 215n and p-type impurity regions 214p and 215p.

(12) Subsequently, annealing is performed by the application of laser light 216 to activate the implanted impurity ions. An XeCl excimer laser (wavelength: 308 nm, pulse width: 40 nsec) is used as this laser light 216, and the application of laser light is performed by 20 shots per portion with a radiation energy density of 250 mJ/cm$^2$.

Figure 8F:
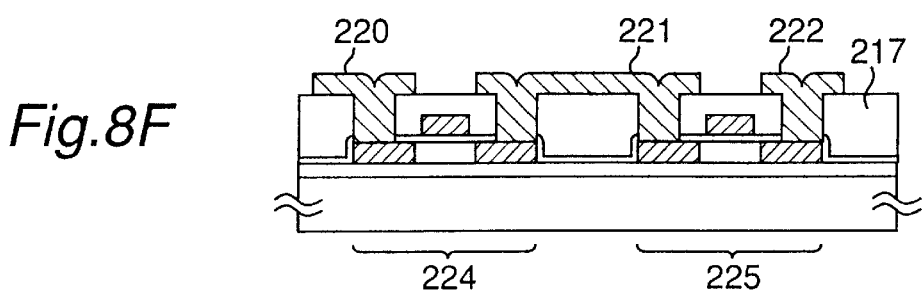
Figure 9:
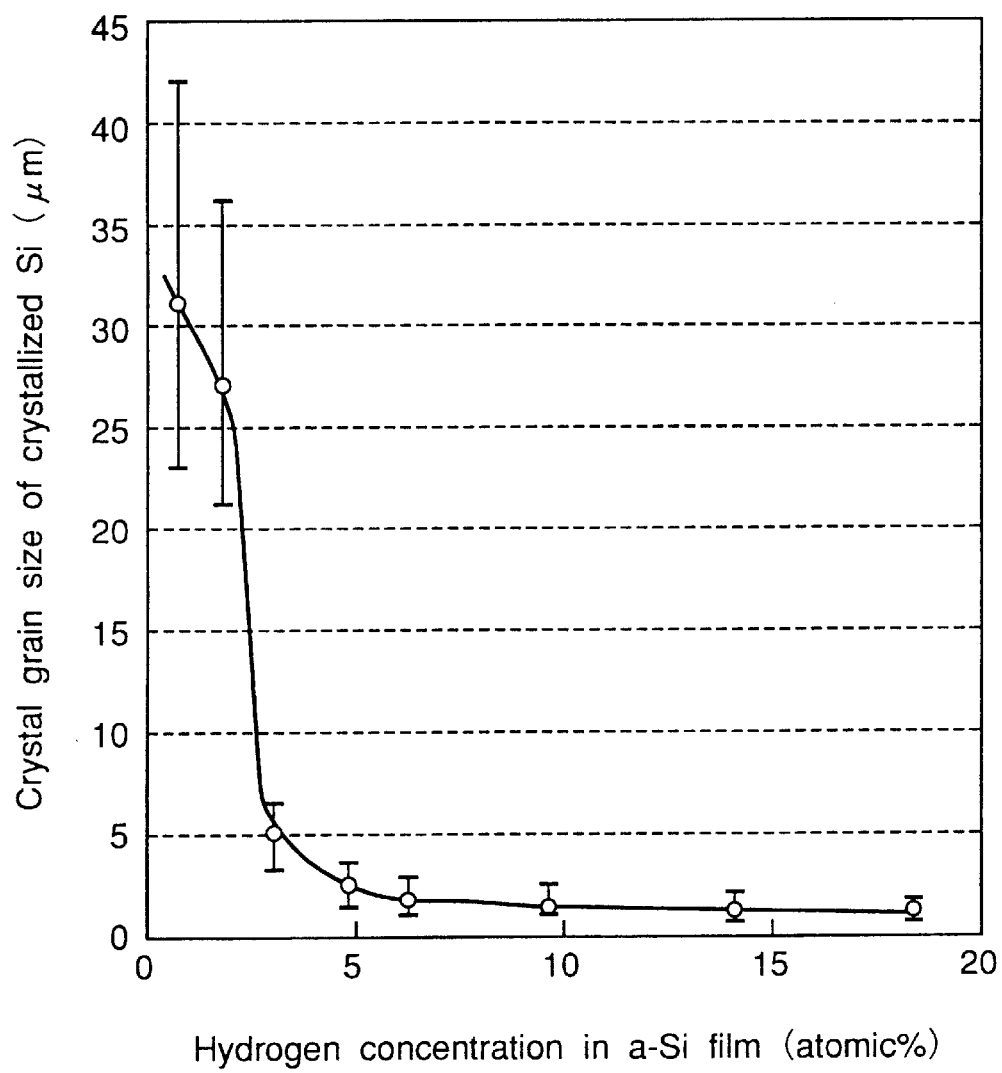
FIG. 9 is a graph showing a relation between a hydrogen concentration in an amorphous silicon film and a crystal grain size of a crystalline silicon film.
Figure 10A:
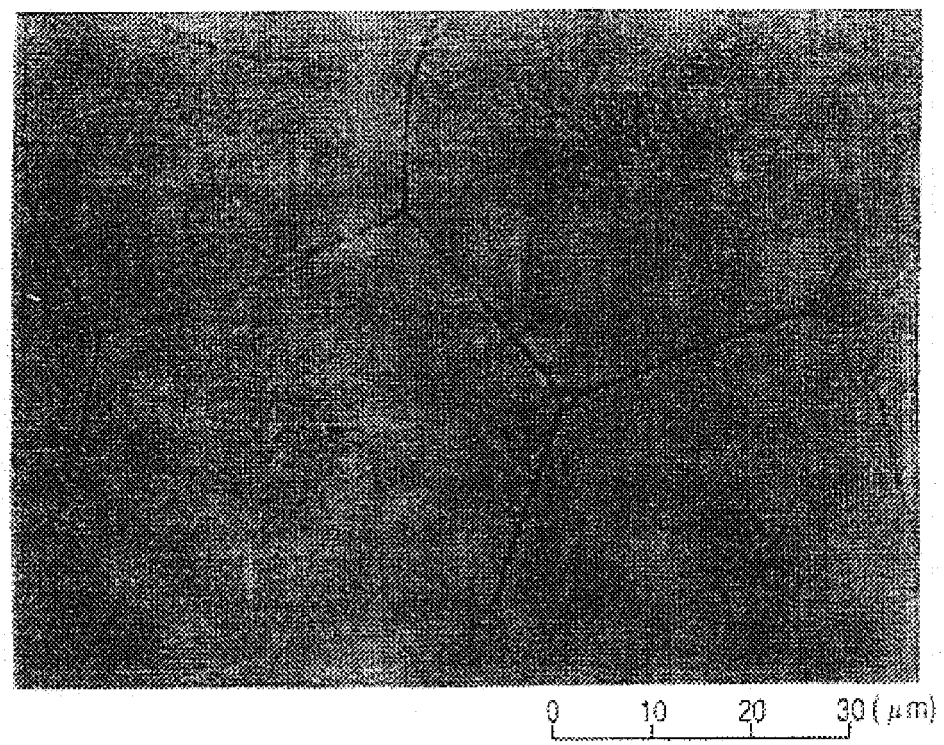
FIG. 10A is a view of an optical microscope photograph of a surface state of a crystalline silicon film obtained by crystallizing an amorphous silicon film having a hydrogen concentration of not higher than 3 atomic %.
Figure 10B:
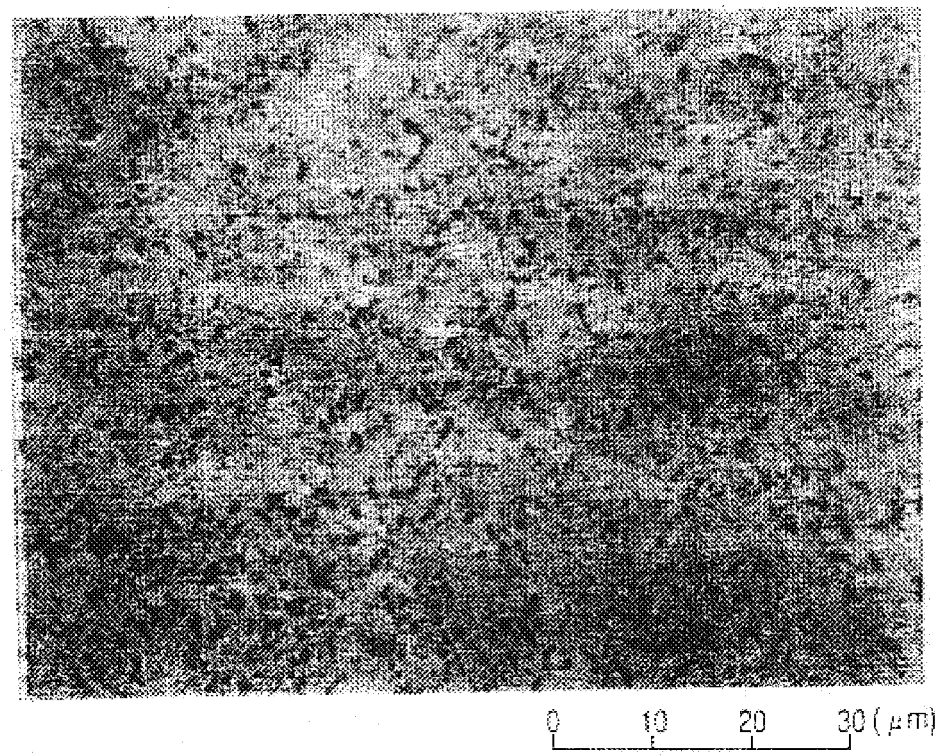
FIG. 10B is a view of an optical microscope photograph of a surface state of a crystalline silicon film obtained by crystallizing an amorphous silicon film having a hydrogen concentration of about 10 atomic %.

(13) Subsequently, as shown in FIG. 8F, a silicon oxide film having a thickness of 900 nm is formed as an interlayer insulating film 217 by the plasma CVD method. A contact hole is formed through this film, and TFT electrodes and wiring 220, 221 and 222 are formed of a bilayer of metal materials of, for example, titanium nitride and aluminum.

(14) Finally, heat treatment is performed at a temperature of 350° C. for one hour in a hydrogen atmosphere at 1 atm, completing an n-type TFT 224 and a p-type TFT 225. Further, as the need arises, a protecting film constructed of, for example, a silicon nitride film may be formed on the n-type TFT 224 and the p-type TFT 225.

In the CMOS structure circuit having the n-type TFT 224 and the p-type TFT 225 fabricated according to the second embodiment, the n-type TFT 224 and the p-type TFT 225 have a high field effect mobility of 210 to 250 cm$^2$/Vs and a mobility of 120 to 150 cm$^2$/Vs, respectively as well as a very good threshold voltage characteristic of about 1 V and a threshold voltage characteristic of about −1.5 V, respectively. The TFT characteristic variation, which has been the problem when the conventional catalytic element is employed, can be restrained to a field effect mobility of about ±10% and a threshold voltage of about ±0.2 V, exhibiting stabilized circuit characteristics. The results of measurement are obtained by employing a quartz glass substrate having a size of 400×320 mm as the quartz glass substrate 201 and measuring 30 points of measurement inside the quartz glass substrate.

The second embodiment of the present invention has been described in concrete as above. The present invention is not limited to the aforementioned embodiments and accepts a variety of modifications based on the technical concept of the present invention.

For example, the element of nickel is added to the surface of the amorphous silicon film 203 according to the method for introducing nickel in the second embodiment. However, the element of nickel may be added to the surface of the quartz glass substrate 201. In this case, the crystal growth occurs from the lower surface side of the amorphous silicon film. That is, the crystal growth of the amorphous silicon film may be made to occur from either the upper surface side or the lower surface side of the amorphous silicon film.

Although the addition of the element of nickel is performed by low-voltage DC sputtering, the addition may be performed by, for example, a method for coating an aqueous solution in which nickel salt is dissolved or, for example, the spin coating method. There can be used a variety of other methods such as the method of employing a SOG (spin-on-glass) material as a solvent for dissolving a nickel salt and performing dispersion from an SiO$_2$ film, the method of forming a thin film by vapor deposition and plating and the method of directly introducing the element of nickel by ion doping.

Although nickel is employed as the catalytic element, there may be employed cobalt, palladium, platinum, copper, silver, gold, indium, zinc, aluminum or antimony as an impurity metal element for promoting the crystallization.

As a means for promoting the crystallinity of the crystalline silicon film, the heating method by the application of the XeCl excimer laser, or the pulse laser is used. However, a heating method using another laser of, for example, a continuous oscillation Ar laser may be used. Instead of laser light, there may be used infrared light or flash lamp light having an intensity equivalent to that of laser light. That is, the crystallinity may be promoted by the so-called RTA (Rapid Thermal Annealing, also called RTP: Rapid Thermal Processing) for heating the sample by raising the temperature to 1000 to 1200° C. (temperature of silicon monitor) in a short time.

The thin film semiconductor device of the present invention may be applied to, for example, a contact type image sensor, a driver-integrated type thermal head, a driver-integrated type optical writing device or display device employing an organic EL element or the like as a light-emitting element and a three-dimensional IC besides the LCD use active matrix type substrate. In this case, these devices are allowed to have high performance of an increased operating speed, a high resolution and so on.

Furthermore, without being limited to the MOS type transistor described in connection with the first and second embodiments, the present invention can be widely applied to general semiconductor processes of bipolar transistors and electrostatic induction transistors employing a crystalline semiconductor as an element material.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device fabricating method comprising:
   a process for forming an amorphous silicon film containing 3 to 25 atomic percent hydrogen on a substrate having an insulating surface;
   a process for adding to a surface of the amorphous silicon film catalytic element for promoting crystallization of the amorphous silicon film; and
   a process for crystallizing the amorphous silicon film and removing hydrogen therefrom by subjecting the amorphous silicon film to which the catalytic element has been added to heat treatment.

2. A semiconductor device fabricating method as claimed in claim 1 wherein
   the amorphous silicon film is formed by a plasma CVD method at a heating temperature of not higher than 400° C.

3. A semiconductor device fabricating method as claimed in claim 1, wherein the catalytic element comprises nickel.

4. A semiconductor device fabricating method as claimed in claim 3, wherein, after the addition of the nickel to the surface of the amorphous silicon film or the surface of the substrate, the nickel concentration of the surface is within a range of 1×10$^{12}$ to 5×10$^{13}$ atoms/cm$^2$.

5. A semiconductor device fabricating method as claimed in claim 3, wherein the process for adding nickel to the surface of the amorphous silicon film or the surface of the substrate is performed by spin coating a solution comprising nickel on the surface of the amorphous silicon film or the surface of the substrate.

6. A semiconductor device fabricating method as claimed in claim 3, wherein the process for adding nickel to the surface of the amorphous silicon film or the surface of the substrate is performed by DC sputtering of nickel at a low voltage.

7. A semiconductor device fabricating method as claimed in claim 1, wherein the heating process for crystallizing the amorphous silicon film has a first step for releasing excessive hydrogen existing in the amorphous silicon film and a second step for crystal growth of the amorphous silicon film.

8. A semiconductor device fabricating method as claimed in claim 7, wherein
   the heating process of the first step is performed within a temperature range of 450° C. to 530° C., and the heating process of the second step is performed within a temperature range of 530° C. to 650° C.

9. A semiconductor device fabricating method as claimed in claim 1, further comprising a process, which is to be performed after the crystallization of the amorphous silicon film through heat treatment, for moving most of the catalytic element remaining in the crystallized silicon film toward a region outside a region in which a semiconductor element is to be formed.

10. A semiconductor device fabricating method as claimed in claim 1, further comprising a process, which is to be performed after the crystallization of the amorphous silicon film through heat treatment, for further promoting the crystallinity of the silicon film by applying laser light to the crystallized silicon film.

11. A semiconductor device fabricating method as claimed in claim 1, further comprising a process, which is to be performed after the crystallization of the amorphous silicon film through heat treatment, for further promoting the crystallinity of the silicon film by subjecting the crystallized silicon film to heat treatment at an elevated temperature higher than the heat treatment temperature in an oxidizing atmosphere.

12. A semiconductor device fabricating method as claimed in claim 1, wherein the hydrogen content in the amorphous silicon film is within a range of 5 to 25 atomic percent.

13. A semiconductor device fabricating method as claimed in claim 1, wherein the hydrogen content in the amorphous silicon film is within a range of 10 to 25 atomic percent.

14. A semiconductor device fabricating method as claimed in claim 1, wherein in the process for forming the amorphous silicon film, the hydrogen content in the amorphous silicon film is adjusted such that minute crystal particles are uniformly formed by the subsequent heat treatment.

15. A semiconductor device fabricating method comprising:
a process for adding a catalytic element for promoting crystallization of an amorphous silicon film to a substrate having an insulating surface;
a process for forming the amorphous silicon film containing 3 to 25 atomic percent hydrogen on the surface which belongs to the substrate and to which the catalytic element has been added; and
a process for crystallizing the amorphous silicon film by subjecting the amorphous silicon film to heat treatment.

16. A semiconductor device fabricating method as claimed in claim 15, wherein the amorphous silicon film is formed by a plasma CVD method at a heating temperature of not higher than 400° C.

17. A semiconductor device fabricating method as claimed in claim 15, wherein the catalytic element comprises nickel.

18. A semiconductor device fabricating method as claimed in claim 17, wherein, after the addition of the nickel to the surface of the amorphous silicon film or the surface of the substrate, the nickel concentration of the surface is within a range of $1\times10^{12}$ to $5\times10^{13}$ atoms/cm$^2$.

19. A semiconductor device fabricating method as claimed in claim 17, wherein the process for adding the nickel to the surface of the amorphous silicon film or the surface of the substrate is performed by spin coating a nickel inclusive solution on the surface of the amorphous silicon film or the surface of the substrate.

20. A semiconductor device fabricating method as claimed in claim 17, wherein the process for adding the nickel to the surface of the amorphous silicon film or the surface of the substrate is performed by DC sputtering the element of nickel at a low voltage.

21. A semiconductor device fabricating method as claimed in claim 15, wherein the heating process for crystallizing the amorphous silicon film has a first step for releasing excessive hydrogen existing in the amorphous silicon film and a second step intended for crystal growth of the amorphous silicon film.

22. A semiconductor device fabricating method as claimed in claim 21, wherein the heating process of the first step is performed within a temperature range of 450° C. to 530° C., and the heating process of the second step is performed within a temperature range of 530° C. to 650° C.

23. A semiconductor device fabricating method as claimed in claim 15, further comprising a process, which is to be performed after the crystallization of the amorphous silicon film through heat treatment, for moving most of the catalytic element remaining in the crystallized silicon film toward a region outside a region in which a semiconductor element is to be formed.

24. A semiconductor device fabricating method as claimed in claim 15, further comprising a process, which is to be performed after the crystallization of the amorphous silicon film through heat treatment, for further promoting the crystallinity of the silicon film by applying laser light to the crystallized silicon film.

25. A semiconductor device fabricating method as claimed in claim 15, further comprising a process, which is to be performed after the crystallization of the amorphous silicon film through heat treatment, for further promoting the crystallinity of the silicon film by subjecting the crystallized silicon film to heat treatment at an elevated temperature higher than the heat treatment temperature in an oxidizing atmosphere.

26. A semiconductor device fabricating method as claimed in claim 15, wherein the hydrogen content in the amorphous silicon film is within a range of 5 to 25 atomic percent.

27. A semiconductor device fabricating method as claimed in claim 15, wherein the hydrogen content in the amorphous silicon film is within a range of 10 to 25 atomic percent.

28. A semiconductor device fabricating method as claimed in claim 15, wherein in the process for forming the amorphous silicon film, the hydrogen content is adjusted such that minute crystal particles are uniformly formed by the subsequent heat treatment.

29. A semiconductor device fabricating method comprising:
forming a film comprising amorphous silicon and hydrogen on a substrate;
adding to a surface of the film comprising amorphous silicon and hydrogen at least one catalytic element for promoting crystallization of the film;
crystallizing the film comprising amorphous silicon by subjecting the film to which the catalytic element has been added to heat treatment;
wherein in forming the film comprising amorphous silicon and hydrogen the hydrogen content is adjusted such that minute crystal particles are uniformly formed by the subsequent heat treatment; and wherein the hydrogen content in the film comprising amorphous silicon and hydrogen is within a range of 3 to 25 atomic percent.

30. A semiconductor device fabricating method as claimed in claim 29, wherein the film comprising amorphous silicon is formed by a plasma CVD method at a heating temperature of not higher than 400° C.

31. A semiconductor device fabricating method as claimed in claim 29, wherein the catalytic element comprises nickel.

32. A semiconductor device fabricating method as claimed in claim 31, wherein, after the addition of the nickel to the surface of the film comprising amorphous silicon or the surface of the substrate, the nickel concentration of the surface is within a range of $1\times10^{12}$ to $5\times10^{13}$ atoms/cm$^2$.

33. A semiconductor device fabricating method as claimed in claim 31, wherein the process for adding the nickel to the surface of the film comprising amorphous silicon or the surface of the substrate is performed by spin coating a nickel inclusive solution on the surface of the film or the surface of the substrate.

34. A semiconductor device fabricating method as claimed in claim 31, wherein the process for adding nickel to the surface of the film comprising amorphous silicon or the surface of the substrate is performed by DC sputtering nickel.

35. A semiconductor device fabricating method as claimed in claim 29, wherein the heating process for crystallizing the film comprising amorphous silicon has a first step for releasing excessive hydrogen existing in the film comprising amorphous silicon and a second step intended for crystal growth of the film comprising amorphous silicon.

36. A semiconductor device fabricating method as claimed in claim 35, wherein the heating process of the first step is performed within a temperature range of 450° C. to 530° C., and the heating process of the second step is performed within a temperature range of 530° C. to 650° C.

37. A semiconductor device fabricating method as claimed in claim 29, further comprising a process, which is to be performed after the crystallization of the film comprising amorphous silicon, for moving most of the catalytic element remaining in the crystallized silicon film toward a region outside a region in which a semiconductor element is to be formed.

38. A semiconductor device fabricating method as claimed in claim 29, further comprising a process, which is to be performed after the crystallization of the amorphous silicon, for further promoting the crystallinity of the silicon film by applying laser light to the crystallized silicon film.

39. A semiconductor device fabricating method as claimed in claim 29, further comprising a process, which is to be performed after the crystallization of the amorphous silicon film, for further promoting the crystallinity of the silicon film by subjecting the crystallized silicon film to heat treatment at an elevated temperature higher than the heat treatment temperature in an oxidizing atmosphere.

40. A semiconductor device fabricating method as claimed in claim 29, wherein the hydrogen content in the film comprising amorphous silicon is within a range of 5 to 25 atomic percent.

41. A semiconductor device fabricating method as claimed in claim 29, wherein the hydrogen content in the film comprising amorphous silicon is within a range of 10 to 25 atomic percent.

42. A semiconductor device fabricating method comprising:
   a process for adding a catalytic element for promoting crystallization of an amorphous silicon film to a substrate having an insulating surface;
   forming the amorphous silicon film, including hydrogen, on the catalytic element, the process for forming the amorphous silicon film further comprising hydrogen on the surface which belongs to the substrate and to which the catalytic element has been added; and
   a process for crystallizing the amorphous silicon film by subjecting the amorphous silicon film to heat treatment, wherein
   in the process for forming the amorphous silicon film, the hydrogen content is adjusted such that minute crystal particles are uniformly formed by the subsequent heat treatment.

43. A semiconductor device fabricating method as claimed in claim 42, wherein the hydrogen content in the amorphous silicon film is within a range of 3 to 25 atomic percent.

44. A semiconductor device fabricating method as claimed in claim 42, wherein the amorphous silicon film is formed by a plasma CVD method at a heating temperature of not higher than 400° C.

45. A semiconductor device fabricating method as claimed in claim 42, wherein the element of nickel is used as the catalytic element.

46. A semiconductor device fabricating method as claimed in claim 45, wherein, after the addition of the element of nickel to the surface of the substrate, the nickel concentration of the surface is within a range of $1\times10^{12}$ to $5\times10^{13}$ atoms/cm$^2$.

47. A semiconductor device fabricating method as claimed in claim 45, wherein the process for adding the element of nickel to the surface of the substrate is performed by spin coating a nickel solution on the surface.

48. A semiconductor device fabricating method as claimed in claim 45, wherein the process for adding the element of nickel to the surface of the substrate is performed by DC sputtering the element of nickel at a low voltage.

49. A semiconductor device fabricating method as claimed in claim 42, wherein the heating process for crystallizing the amorphous silicon film has a first step for releasing excessive hydrogen existing in the amorphous silicon film and a second step intended for crystal growth of the amorphous silicon film.

50. A semiconductor device fabricating method as claimed in claim 49, wherein the heating process of the first step is performed within a temperature range of 450° C. to 530° C., and the heating process of the second step is performed within a temperature range of 530° C. to 650° C.

51. A semiconductor device fabricating method as claimed in claim 42, further comprising process, which is to be performed after the crystallization of the amorphous silicon film through heat treatment, for moving most of the catalytic element remaining in the crystallized silicon film toward a region outside a region in which a semiconductor element is to be formed.

52. A semiconductor device fabricating method as claimed in claim 42, further comprising a process, which is to be performed after the crystallization of the amorphous silicon film through heat treatment, for further promoting the crystallinity of the silicon film by applying laser light to the crystallized silicon film.

53. A semiconductor device fabricating method as claimed in claim 42, further comprising a process, which is to be performed after the crystallization of the amorphous silicon film through heat treatment, for further promoting the crystallinity of the silicon film by subjecting the crystallized silicon film to heat treatment at an elevated temperature higher than the heat treatment in an oxidizing atmosphere.

54. A semiconductor device fabricating method as claimed in claim 42, wherein the hydrogen content in the amorphous silicon film is within a range of 5 to 25 atomic percent.

55. A semiconductor device fabricating method as claimed in claim 42, wherein the hydrogen content in the amorphous silicon film is within a range of 10 to 25 atomic percent.

56. A semiconductor device fabricating method comprising:
   forming a film comprising amorphous silicon and hydrogen;
   adding to a surface of the film comprising amorphous silicon at least one catalytic element for promoting crystallization of the film comprising amorphous silicon, the at least one catalytic element being added to the surface of the film comprising amorphous silicon in a concentration of from $1\times10^{12}$ atoms/cm$^2$ to $5\times10^{13}$ atoms/cm$^2$; and crystallizing the film comprising amorphous silicon by subjecting the film to which the at least one catalytic element has been added to heat treatment.

57. A semiconductor device fabricating method comprising:

adding at least one catalytic element for promoting crystallization of a film comprising amorphous silicon and hydrogen to a surface, the at least one catalytic element being added to the surface in a concentration of from $1\times10^{12}$ atoms/cm$^2$ to $5\times10^{13}$ atoms/cm$^2$;

forming the film comprising amorphous silicon and hydrogen on the surface to which the at least one catalytic element has been added; and crystallizing the film comprising amorphous silicon by subjecting the film to heat treatment.

58. A semiconductor device fabricating method comprising:

forming a film comprising amorphous silicon and from about 10–15% hydrogen on a substrate at a heating temperature of no greater than 400 degrees C.;

adding at least one catalytic element for promoting crystallization of the film comprising amorphous silicon to the surface of the film in a concentration of from $1\times10^{12}$ atoms/cm$^2$ to $5\times10^{13}$ atoms/cm$^2$; and crystallizing the film comprising amorphous silicon and removing hydrogen therefrom by subjecting the film to which the catalytic element has been added to heat treatment.

* * * * *